(12) United States Patent
Akimoto et al.

(10) Patent No.: US 9,029,893 B2
(45) Date of Patent: *May 12, 2015

(54) SEMICONDUCTOR LIGHT EMITTING DEVICE AND METHOD FOR MANUFACTURING THE SAME

(71) Applicant: Kabushiki Kaisha Toshiba, Minato-ku, Tokyo (JP)

(72) Inventors: Yosuke Akimoto, Tokyo (JP); Akihiro Kojima, Kanagawa-ken (JP); Miyoko Shimada, Kanagawa-ken (JP); Hideyuki Tomizawa, Kanagawa-ken (JP); Yoshiaki Sugizaki, Kanagawa-ken (JP); Hideto Furuyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/848,149

(22) Filed: Mar. 21, 2013

(65) Prior Publication Data

US 2014/0231845 A1  Aug. 21, 2014

(30) Foreign Application Priority Data

Feb. 18, 2013 (JP) .................................. 2013-029266

(51) Int. Cl.
*H01L 33/00* (2010.01)
*H01L 33/50* (2010.01)
*H01L 33/46* (2010.01)

(52) U.S. Cl.
CPC .............. *H01L 33/50* (2013.01); *H01L 33/46* (2013.01); *H01L 2933/0041* (2013.01)

(58) Field of Classification Search
CPC .................. H01L 31/02322; H01L 31/02325; H01L 33/22; H01L 33/387; H01L 33/46; H01L 33/60; H01L 51/5268
USPC ........................... 257/91, 93, 95, 98, E33.001
See application file for complete search history.

(56) References Cited

U.S. PATENT DOCUMENTS 8,110,421 B2   2/2012  Sugizaki et al.
8,552,448 B2 * 10/2013  Ichikawa ......................... 257/98

(Continued)

FOREIGN PATENT DOCUMENTS

JP   2009-158541 A   7/2009
JP   2010-232525 A  10/2010

(Continued)

OTHER PUBLICATIONS

Taiwanese Office Action dated Nov. 12, 2014 issued in counterpart Taiwanese Application No. 102109314.

*Primary Examiner* — Tan N Tran
(74) *Attorney, Agent, or Firm* — Holtz, Holtz, Goodman & Chick PC

(57) ABSTRACT

According to one embodiment, a semiconductor light emitting device includes a semiconductor layer, a p-side electrode, an n-side electrode, a fluorescent material layer and a reflection film. The semiconductor layer has a first surface and a second surface on an opposite side to the first surface and includes a light emitting layer. The p-side electrode and the n-side electrode are provided on the semiconductor layer on a side of the second surface. The fluorescent material layer is provided on a side of the first surface and includes a plurality of fluorescent materials and a bonding material. The bonding material integrates the fluorescent materials. The reflection film is partially provided on the fluorescent material layer and has a higher reflectance to the radiated light of the light emitting layer than to the radiated light of the fluorescent materials.

22 Claims, 19 Drawing Sheets

(56) References Cited

U.S. PATENT DOCUMENTS

2004/0190304 A1* 9/2004 Sugimoto et al. ............. 362/555
2007/0161316 A1  7/2007 Taguchi et al.
2011/0260184 A1* 10/2011 Furuyama ...................... 257/98
2011/0300644 A1 12/2011 Akimoto et al.
2012/0097972 A1  4/2012 Sugizaki et al.

FOREIGN PATENT DOCUMENTS

| | | |
|---|---|---|
| JP | 2011-165827 A | 8/2011 |
| JP | 2011-243712 A | 12/2011 |
| TW | 201234664 A | 8/2012 |
| WO | 2012107973 A1 | 8/2012 |

* cited by examiner

SEMICONDUCTOR LIGHT EMITTING DEVICE AND METHOD FOR MANUFACTURING THE SAME

CROSS-REFERENCE TO RELATED APPLICATIONS

This application is based upon and claims the benefit of priority from the prior Japanese Patent Application No. 2013-029266, filed on Feb. 18, 2013; the entire contents of which are incorporated herein by reference.

FIELD

Embodiments described herein relate generally to a semiconductor light emitting device and a method for manufacturing the same.

BACKGROUND

A semiconductor light emitting device that emits visible light such as white light or light in other wavelength ranges by combining a semiconductor light emitting element and a fluorescent material is expanding the use as a small, easy-to-handle light source. However, in such a semiconductor light emitting device, a variation in chromaticity may occur and the improvement thereof is required.

DETAILED DESCRIPTION

Figure 1:
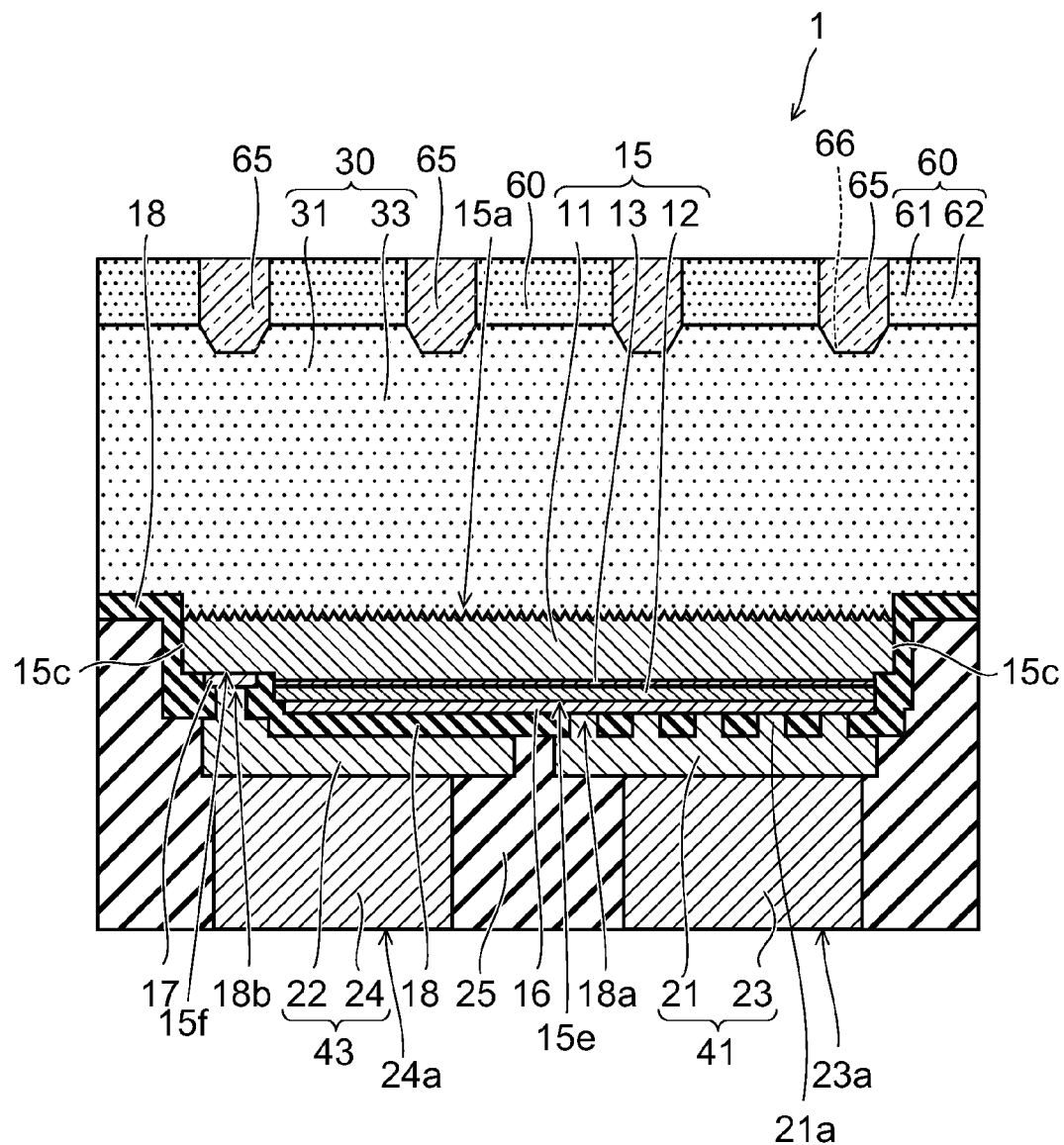
FIG. 1 is a schematic cross-sectional view of a semiconductor light emitting device of a first embodiment.

According to one embodiment, a semiconductor light emitting device includes a semiconductor layer, a p-side electrode, an n-side electrode, a fluorescent material layer and a reflection film. The semiconductor layer has a first surface and a second surface on an opposite side to the first surface and includes a light emitting layer. The p-side electrode is provided on the semiconductor layer on a side of the second surface. The n-side electrode is provided on the semiconductor layer on the side of the second surface. The fluorescent material layer is provided on a side of the first surface. The fluorescent material layer includes a plurality of fluorescent materials and a bonding material. The fluorescent materials are configured to be excited by radiated light of the light emitting layer and to emit light of a different wavelength from the radiated light of the light emitting layer. The bonding material integrates the fluorescent materials and is configured to transmit the radiated light of the light emitting layer and the radiated light of the fluorescent materials. The reflection film is partially provided on the fluorescent material layer and has a higher reflectance to the radiated light of the light emitting layer than to the radiated light of the fluorescent materials.

Various embodiments will be described hereinafter with reference to the accompanying drawings. Identical components in the drawings are marked with the same reference numerals, and a detailed description thereof is omitted as appropriate and different components are described.

First Embodiment

FIG. 1 is a schematic cross-sectional view of a semiconductor light emitting device 1 of a first embodiment.

The semiconductor light emitting device 1 includes a semiconductor layer 15 including a light emitting layer 13. The semiconductor layer 15 has a first surface 15a and a second surface 15b on the opposite side to it (see FIG. 3A). The semiconductor layer 15 has a portion (an emitting region) 15e including the light emitting layer 13 and a portion (a non-emitting region) 15f not including the light emitting layer 13. The portion 15e including the light emitting layer 13 is a portion of the semiconductor layer 15 where the light emitting layer 13 is stacked. The portion 15f not including the light emitting layer 13 is a portion of the semiconductor layer 15 where the light emitting layer 13 is not stacked. The portion including the light emitting layer 13 shows the emitting region, and shows the region of a stacked structure that includes the light emitting layer 13 and is capable of extracting the emission light of the light emitting layer 13 to the outside.

On the second surface 15b side, a p-side electrode 16 is provided on the portion 15e including the light emitting layer 13, and an n-side electrode 17 is provided on the portion 15f not including the light emitting layer. A current is supplied to the light emitting layer 13 via the p-side electrode 16 and the n-side electrode 17, and the light emitting layer 13 emits light. The light emitted from the light emitting layer 13 is emitted to the outside via the first surface 15a.

The p-side electrode 16 and the n-side electrode 17 are provided on the second surface of the semiconductor layer 15. A support body described later is provided on the second surface side of the semiconductor layer 15. A light emitting element including the semiconductor layer 15, the p-side electrode 16, and the n-side electrode 17 is supported by the support body provided on the second surface side.

A fluorescent material layer 30 is provided on the first surface 15a of the semiconductor layer 15. The fluorescent material layer 30 contains a plurality of fluorescent materials 31. The fluorescent material 31 is excited by the radiated light of the light emitting layer 13, and emits light of a different wavelength from the radiated light of the light emitting layer 13.

The plurality of fluorescent materials 31 are integrated by a first bonding material 33. The first bonding material 33 transmits the radiated light of the light emitting layer 13 and the radiated light of the fluorescent material 31. Here, "transmit" includes also the case of absorbing part of the light.

A reflection film that has reflection properties dependent on the wavelength and efficiently reflects the radiated light of the light emitting layer 13 is provided on the fluorescent material layer 30.

In the first embodiment, a scattering layer 60 is provided as the reflection film on the fluorescent material layer 30. The scattering layer 60 contains a plurality of scattering materials 61. The scattering material 61 scatters the radiated light of the light emitting layer 13.

The plurality of scattering materials 61 are integrated by a second bonding material 62. The second bonding material 62 transmits the radiated light of the light emitting layer 13 and the radiated light of the fluorescent material 31.

The scattering layer 60 is partially provided on the upper surface of the fluorescent material layer 30. The scattering layer 60 is provided on the upper surface of the fluorescent material layer 30 in a planar pattern of, for example, an island configuration, a line configuration, a lattice configuration, or the like.

A transparent material 65 is provided on the upper surface of the fluorescent material layer 30 where the scattering layer 60 is not provided. The transparent material 65 is put in between a scattering layer 60 and a scattering layer 60 partially provided on the upper surface of the fluorescent material layer 30. The transparent material 65 transmits the radiated light of the light emitting layer 13 and the radiated light of the fluorescent material 31. The portion on the upper surface of the fluorescent material layer 30 where the scattering layer 60 is not provided may be an air gap.

The portion of the upper surface of the fluorescent material layer 30 where the scattering layer 60 is provided is formed to be flat. A recess 66 is formed in the portion of the upper surface of the fluorescent material layer 30 where the scattering layer 60 is not provided. The transparent material 65 is put also in the recess 66.

The semiconductor layer 15 includes a first semiconductor layer 11, a second semiconductor layer 12, and the light emitting layer 13. The light emitting layer 13 is provided between the first semiconductor layer 11 and the second semiconductor layer 12. The first semiconductor layer 11 and the second semiconductor layer 12 contain, for example, gallium nitride.

The first semiconductor layer 11 includes, for example, an underlying buffer layer and an n-type GaN layer. The second semiconductor layer 12 includes, for example, a p-type GaN layer. The light emitting layer 13 contains a material that emits blue light, violet light, bluish violet light, ultraviolet light, etc. The emission wavelength of the light emitting layer 13 is, for example, 430 to 470 nm.

The second surface of the semiconductor layer 15 is fashioned in a concave-convex form. The convex portion of the concavity and convexity is the portion 15e including the light emitting layer 13, and the concave portion is the portion 15f not including the light emitting layer 13. The second surface of the portion 15e including the light emitting layer 13 is a surface of the second semiconductor layer 12, and the p-side electrode 16 is provided on the surface. The second surface of the portion 15f not including the light emitting layer 13 is a surface of the first semiconductor layer 11, and the n-side electrode 17 is provided on the surface.

In the second surface of the semiconductor layer 15, for example, the area of the portion 15e including the light emitting layer 13 is larger than the area of the portion 15f not including the light emitting layer 13. The area of the p-side electrode 16 provided on the portion 15e including the light emitting layer 13 is larger than the area of the n-side electrode 17 provided on the portion not including the light emitting layer 13. Thereby, a large light emitting surface is obtained, and the light output can be increased.

An insulating film 18 is provided as a first insulating film on the second surface side of the semiconductor layer 15. The insulating film 18 covers and protects the second surface of the semiconductor layer 15, the p-side electrode 16, and the n-side electrode 17.

The insulating film 18 is provided also on the side surface of the light emitting layer 13 and the side surface of the second semiconductor layer 12, and covers these side surfaces. The insulating film 18 is provided also on a side surface (a side surface of the first semiconductor layer 11) 15c continuing from the first surface 15a of the semiconductor layer 15, and covers the side surface 15c. The insulating film 18 is not provided on the first surface 15a of the semiconductor layer 15.

The insulating film 18 is, for example, an inorganic film such as a silicon oxide film and a silicon nitride film. Alternatively, the insulating film 18 is a resin such as a polyimide excellent in the patternability of minute openings. In the case where a resin is used as the insulating film 18, for example, an inorganic film such as a silicon oxide film may be provided between the insulating film 18 and the semiconductor layer 15. The inorganic film covers and protects the side surface of the light emitting layer 13 and the side surface of the second semiconductor layer 12.

On a surface of the insulating film 18 on the opposite side to the semiconductor layer 15, a p-side interconnection layer 21 and an n-side interconnection layer 22 are provided away from each other. The insulating film 18 includes a first opening 18a leading to the p-side electrode 16 and a second opening 18b leading to the n-side electrode 17. Although the insulating film 18 includes a plurality of first openings 18a in the example shown in FIG. 1, also a configuration including one first opening 18a is possible.

The p-side interconnection layer 21 is provided on the insulating film 18 and in the first opening 18a. The p-side interconnection layer 21 is electrically connected to the p-side electrode 16 via a via 21a provided in the first opening 18a. The n-side interconnection layer 22 is provided on the insulating film 18 and in the second opening 18b. The n-side interconnection layer 22 is electrically connected to the n-side electrode 17 through a via provided in the second opening 18b.

A p-side metal pillar 23 is provided on a surface of the p-side interconnection layer 21 on the opposite side to the p-side electrode 16. A p-side interconnection unit 41 includes the p-side interconnection layer 21 and the p-side metal pillar 23.

An n-side metal pillar 24 is provided on a surface of the n-side interconnection layer 22 on the opposite side to the n-side electrode 17. An n-side interconnection unit 43 includes the n-side interconnection layer 22 and the n-side metal pillar 24.

An insulating film 25 is provided as a second insulating film between the p-side interconnection unit 41 and the n-side interconnection unit 43. The insulating film 25 is provided between the p-side interconnection layer 21 and the n-side interconnection layer 22 so as to be in contact with the side surface of the p-side interconnection layer 21 and the side surface of the n-side interconnection layer 22. The insulating film 25 is provided between the p-side metal pillar 23 and the n-side metal pillar 24 so as to be in contact with the side surface of the p-side metal pillar 23 and the side surface of the n-side metal pillar 24. That is, the insulating film 25 is put in between the p-side interconnection layer 21 and the n-side interconnection layer 22 and between the p-side metal pillar 23 and the n-side metal pillar 24.

The insulating film 25 covers the side surface of the p-side interconnection layer 21, the side surface of the n-side interconnection layer 22, the side surface of the p-side metal pillar 23, and the side surface of the n-side metal pillar 24. An end (surface) of the p-side metal pillar 23 on the opposite side to the p-side interconnection layer 21 is exposed from the insulating film 25, and functions as a p-side external terminal 23a connectable to an external circuit of a mounting substrate etc. An end (surface) of the n-side metal pillar 24 on the opposite side to the n-side interconnection layer 22 is exposed from the insulating film 25, and functions as an n-side external terminal 24a connectable to the external circuit of the mounting substrate etc. The p-side external terminal 23a and the n-side external terminal 24a are bonded to the land pattern of the mounting substrate via, for example, a solder or a conductive bonding material.

The p-side external terminal 23a and the n-side external terminal 24a are exposed at the same surface (the lower surface in FIG. 1) of the insulating film 25. The spacing between the p-side external terminal 23a and the n-side external terminal 24a is wider than the spacing between the p-side interconnection layer 21 and the n-side interconnection layer 22 on the insulating film 18. The spacing between the p-side external terminal 23a and the n-side external terminal 24a is set larger than the spread of a solder in the time of mounting. Thereby, a short circuit between the p-side external terminal 23a and the n-side external terminal 24a via the solder can be prevented.

In contrast, the spacing between the p-side interconnection layer 21 and the n-side interconnection layer 22 may be set narrow up to the limit in terms of processes. Hence, the area of the p-side interconnection layer 21 and the contact area between the p-side interconnection layer 21 and the p-side metal pillar 23 can be enlarged. Thereby, the radiation of heat of the light emitting layer 13 can be promoted.

The area with which the p-side interconnection layer 21 is in contact with the p-side electrode 16 via the plurality of first openings 18a is larger than the area with which the n-side interconnection layer 22 is in contact with the n-side electrode 17 via the second opening 18b. Thereby, the distribution of the current flowing through the light emitting layer 13 can be equalized.

The area of the n-side interconnection layer 22 spreading on the insulating film 18 may be larger than the area of the n-side electrode 17. The area of the n-side metal pillar 24 provided on the n-side interconnection layer 22 (that is, the area of the n-side external terminal 24a) may be larger than the n-side electrode 17. Thereby, the area of the n-side electrode 17 can be made small while a sufficient area of the n-side external terminal 24a for mounting with high reliability is ensured. That is, the area of the portion (non-emitting region) 15f not including the light emitting layer 13 of the semiconductor layer 15 can be reduced, and the area of the portion (emitting region) 15e including the light emitting layer 13 can be enlarged; thereby, the light output can be increased.

The first semiconductor layer 11 is electrically connected to the n-side metal pillar 24 via the n-side electrode 17 and the n-side interconnection layer 22. The second semiconductor layer 12 is electrically connected to the p-side metal pillar 23 via the p-side electrode 16 and the p-side interconnection layer 21.

The p-side metal pillar 23 is thicker than the p-side interconnection layer 21, and the n-side metal pillar 24 is thicker than the n-side interconnection layer 22. The thickness of each of the p-side metal pillar 23, the n-side metal pillar 24, and the insulating film 25 is thicker than the thickness of the semiconductor layer 15. The "thickness" herein is the width of each layer in the vertical direction in FIG. 1.

The aspect ratio (the ratio of the thickness to the planar size) of the metal pillars 23 and 24 may be 1 or more, or smaller than 1. That is, the metal pillars 23 and 24 may be either thicker or thinner than the planar size thereof.

The thickness of the support body including the p-side interconnection layer 21, the n-side interconnection layer 22, the p-side metal pillar 23, the n-side metal pillar 24, and the insulating film 25 is thicker than the thickness of the light emitting element including the semiconductor layer 15, the p-side electrode 16, and the n-side electrode 17.

As described later, the semiconductor layer 15 is formed on a substrate by the epitaxial growth method. The substrate is removed after the support body including the n-side interconnection layer 22, the p-side metal pillar 23, the n-side metal pillar 24, and the insulating film 25 is formed, and the semiconductor layer 15 does not include a substrate on the first surface 15a side. The semiconductor layer 15 is supported by the support body including the insulating film 25 more flexible than the semiconductor layer 15, not by a rigid substrate.

As the material of the p-side interconnection layer 21, the n-side interconnection layer 22, the p-side metal pillar 23, and the n-side metal pillar 24, for example, copper, gold, nickel, silver, and the like may be used. Of these, when copper is used, good thermal conductivity and high migration resistance can be obtained, and the adhesion to insulating materials can be improved.

The insulating film 25 reinforces the p-side metal pillar 23 and the n-side metal pillar 24. For the insulating film 25, a material with a thermal expansion coefficient equal or close to that of the mounting substrate is preferably used. As such a material of the insulating film 25, for example, an epoxy resin, a silicone resin, a fluorine resin, and the like may be given.

In the process of mounting the semiconductor light emitting device 1, the stress due to a solder or the like for bonding the p-side external terminal 23a and the n-side external terminal 24a to the land of the mounting substrate is applied to the semiconductor layer 15. The p-side metal pillar 23, the n-side metal pillar 24, and the insulating film 25 absorb and relax the stress. In particular, by using the insulating film 25 more flexible than the semiconductor layer 15 as part of the support body, the stress relaxation effect can be enhanced.

The p-side interconnection unit 41 including the p-side interconnection layer 21 and the p-side metal pillar 23 is connected to the p-side electrode 16 via the plurality of vias 21a provided in the plurality of first openings 18a away from one another. In this case, the stress applied to the semiconductor layer 15 can be more reduced than in the case where the p-side interconnection unit 41 is connected to the p-side electrode 16 via one via having an area equal to the total of the contact areas of the plurality of vias 21a.

On the other hand, the p-side interconnection layer 21 may be connected to the p-side electrode 16 via a post with a larger planar size than the via 21a provided in one large opening. Thereby, heat dissipation via the p-side electrode 16, the p-side interconnection layer 21, and the p-side metal pillar 23 can be improved.

As described later, the substrate used for the formation of the semiconductor layer 15 is removed from the semiconductor layer 15. Thereby, the height of the semiconductor light emitting device 1 is reduced. By the removal of the substrate, concavity and convexity can be formed on the first surface 15a of the semiconductor layer 15, and the light extraction efficiency can be improved.

For example, wet etching using an alkali-based solution (frost treatment) is performed on the first surface 15a to form fine concvity and conxexity. Thereby, the radiated light of the light emitting layer 13 can be extracted to the outside from the first surface 15a without being totally reflected.

After the substrate is removed, the fluorescent material layer 30 is formed on the first surface 15a of the semiconductor layer 15. That is, the fluorescent material layer 30 is provided on the first surface 15a without interposing a substrate between the first surface 15a of the semiconductor layer 15 and the fluorescent material layer 30.

The fluorescent material layer 30 has a structure in which a plurality of fluorescent materials 31 are scattered in the first bonding material 33. The fluorescent material 31 contains, for example, at least one of a yellow fluorescent material that emits yellow light, a red fluorescent material that emits red light, and a green fluorescent material that emits green light, by being excited by the radiated light of the light emitting layer 13. The fluorescent material 31 may be a ceramic-based fine particle. For the first bonding material 33, for example, a silicone resin may be used.

The scattering layer 60 is provided on the upper surface of the fluorescent material layer 30. The scattering layer 60 has a structure in which a plurality of scattering materials 61 are scattered in the second bonding material 62. For the second bonding material 62, for example, a silicone resin and an acrylic resin may be used.

The scattering material 61 is made of a material having a different refractive index from the second bonding material 62, and is, for example, particulate silica, alumina, hollow nanosilica, or a pore.

The size (particle size) of the scattering material 61 is much smaller than the wavelength of the radiated light of the light emitting layer 13 (excitation light), and is preferably 1/10 or less of the radiated light. Thereby, the excitation light causes Rayleigh scattering in the scattering layer 60. For example, in the case where the peak wavelength of the excitation light is 450 nm, Rayleigh scattering can be caused by setting the size of the scattering material 61 to 45 nm or less.

Since the scattering intensity of Rayleigh scattering is inversely proportional to the fourth power of the wavelength, the scattering intensity becomes weaker as the wavelength of light becomes longer. That is, the light scattering in the scattering layer 60 has a wavelength dependence, and the radiated light of the fluorescent material 31, which has a longer wavelength than the excitation light, is less likely to be scattered in the scattering layer 60 than the excitation light.

That is, the reflectance in the scattering layer 60 of the radiated light of the light emitting layer 13 (excitation light) is higher than the reflectance in the scattering layer 60 of the radiated light of the fluorescent material 31.

By scattering the excitation light in the scattering layer 60 more than the radiated light of the fluorescent material, the difference in the luminance distribution to the light output angle between the excitation light and the radiated light of the fluorescent material can be adjusted.

Since the light emitting layer 13 is a surface light source formed of a two-dimensional aggregate of point light sources, the luminance distribution of the excitation light can be approximated by what is called a Lambertian distribution. That is, the luminance of the excitation light is high in the directly upward direction perpendicular to the first surface 15a (the angle to the direction perpendicular to the first surface 15a being 0), as compared to the other angles.

On the other hand, since the fluorescent material 31 behaves like a point light source that is excited by excitation light to emit light in all directions, the angle dependence of the luminance distribution of the radiated light of the fluorescent material is small. That is, the radiated light of the fluorescent material has a luminance distribution spreading at a wide angle.

Such a difference in the luminance distribution between the excitation light and the radiated light of the fluorescent material may cause what is called color breakup in which the chromaticity varies with the angle of viewing.

In the embodiment, the excitation light is scattered by the scattering materials 61, and takes on a luminance distribution spreading at a wide angle similarly to the radiated light of the fluorescent materials. Consequently, a semiconductor light emitting device with a flat distribution in which the distribution of chromaticity does not depend on the angle much, that is, with little color breakup can be provided. Furthermore, since there is relatively little scattering of the radiated light of the fluorescent material in the scattering layer 60, a semiconductor light emitting device in which the loss of the radiated light of the fluorescent material is suppressed and the overall luminous efficiency is high can be provided.

As described later, by adjusting the coverage of the scattering layer 60 to the upper surface of the fluorescent material layer 30, the chromaticity of light emitted from the semiconductor light emitting device 1 can be adjusted. The adjustment of the coverage of the scattering layer 60 more enables fine adjustments of chromaticity than the adjustment of the film thickness of the fluorescent material layer 30 and the film thickness of the scattering layer 60.

Next, a method for manufacturing the semiconductor light emitting device 1 according to the first embodiment is described with reference to FIG. 2A to FIG. 12B.

Figure 2A:
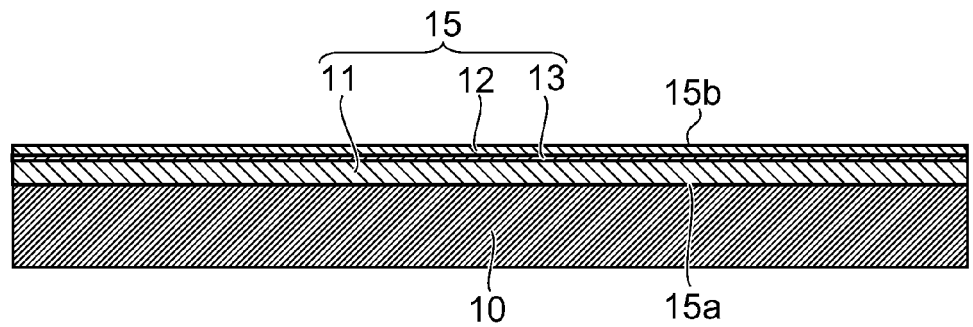
FIG. 2A to FIG. 12B are schematic views showing a method for manufacturing the semiconductor device according to the first embodiment.

FIG. 2A is a cross-sectional view showing the semiconductor layer 15 including the first semiconductor layer 11, the light emitting layer 13, and the second semiconductor layer 12 formed on the major surface of a substrate 10. For example, the MOCVD (metal organic chemical vapor deposition) method is used to sequentially grow the first semiconductor layer 11, the light emitting layer 13, and the second semiconductor layer 12 on the substrate 10.

The substrate 10 is, for example, a silicon substrate or a sapphire substrate. The semiconductor layer 15 is, for example, a nitride semiconductor containing gallium nitride (GaN).

The first semiconductor layer 11 is, for example, an n-type GaN layer. The first semiconductor layer 11 may have a stacked structure including a buffer layer provided on the substrate 10 and an n-type GaN layer provided on the buffer layer. The second semiconductor layer 12 includes, for example, a p-type AlGaN layer provided on the light emitting layer 13 and a p-type GaN layer provided on the p-type AlGaN layer. The light emitting layer 13 has, for example, an MQW (multiple quantum well) structure.

Figure 2B:
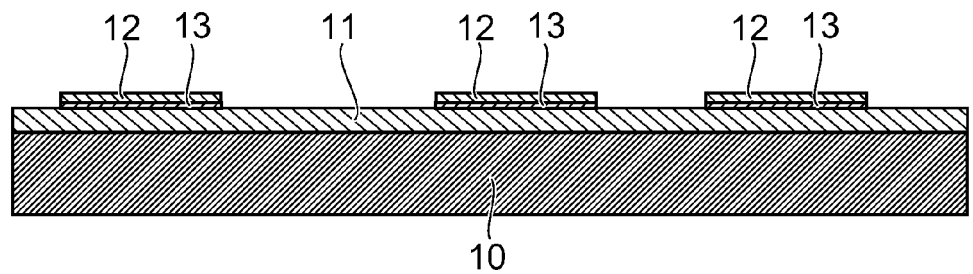
Figure 2C:
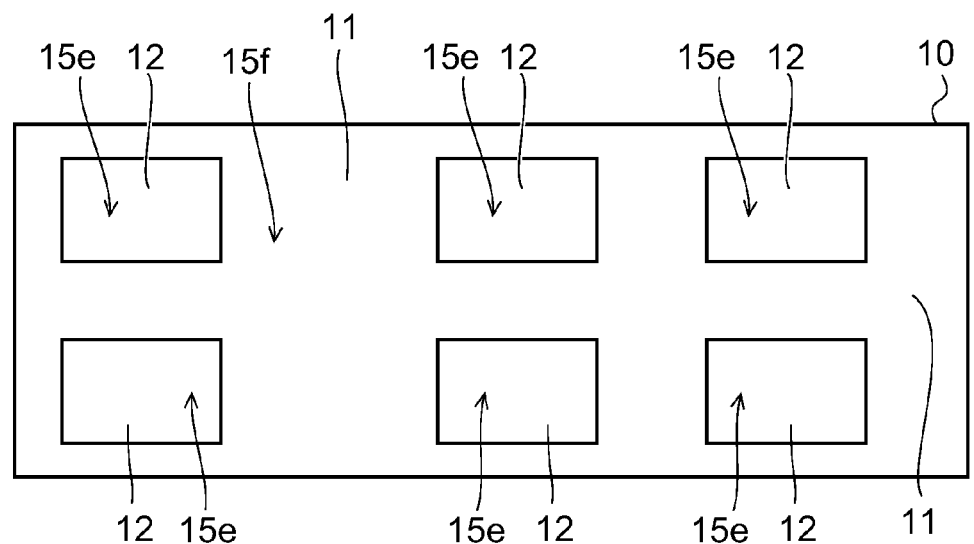

FIG. 2B and FIG. 2C show a state where the second semiconductor layer 12 and the light emitting layer 13 are selectively removed. FIG. 2B is a cross-sectional view, and FIG. 2C is a plan view showing the upper surface side of the substrate 10 (the second surface side of the semiconductor layer 15).

The RIE (reactive ion etching) method, for example, is used to selectively etch the second semiconductor layer 12 and the light emitting layer 13 to expose the first semiconductor layer 11.

As shown in FIG. 2C, the semiconductor layer 12 and the light emitting layer 13 are patterned into an island configuration on the first semiconductor layer 11, and a plurality of emitting regions (portions 15e including the light emitting layer 13) are formed on the substrate 10.

Figure 3A:
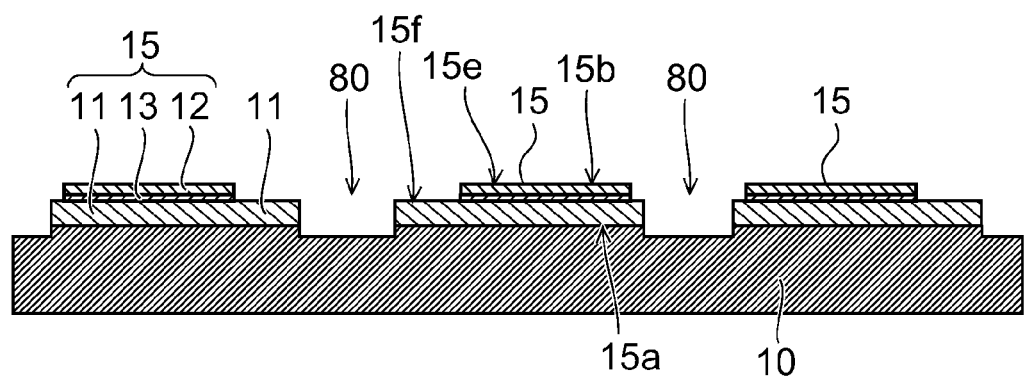
Figure 3B:
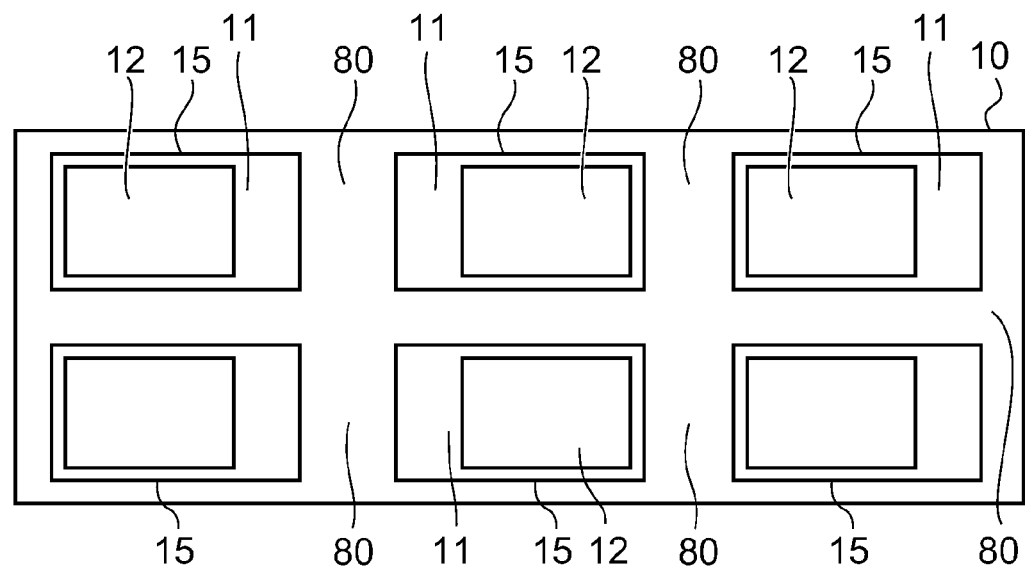

Next, as shown in FIG. 3A and FIG. 3B, the first semiconductor layer 11 is selectively removed. A plurality of semiconductor layers 15 separated from one another are formed on the substrate 10.

FIG. 3A shows a cross section of the substrate 10 and the semiconductor layer 15 formed thereon. For example, an etching mask (not shown) covering the second semiconductor layer 12 and the light emitting layer 13 is provided on the first semiconductor layer 11. Subsequently, the RIE method is used to etch the first semiconductor layer 11 to form a trench 80 with a depth reaching the substrate 10.

FIG. 3B shows the upper surface of FIG. 3A. The trench 80 is provided in a lattice configuration on the substrate 10, and separates the first semiconductor layer 11.

The first surface 15a of the semiconductor layer 15 is a surface in contact with the substrate 10, and the second surface 15b is surfaces of the first semiconductor layer 11 and the second semiconductor layer 12.

For example, the upper surface of the substrate 10, which is a silicon substrate, is etched at some level, and the trench 80 is formed deeper than the first surface 15a.

The trench 80 may be formed after the p-side electrode 16 and the n-side electrode 17 described later are formed.

Figure 4A:
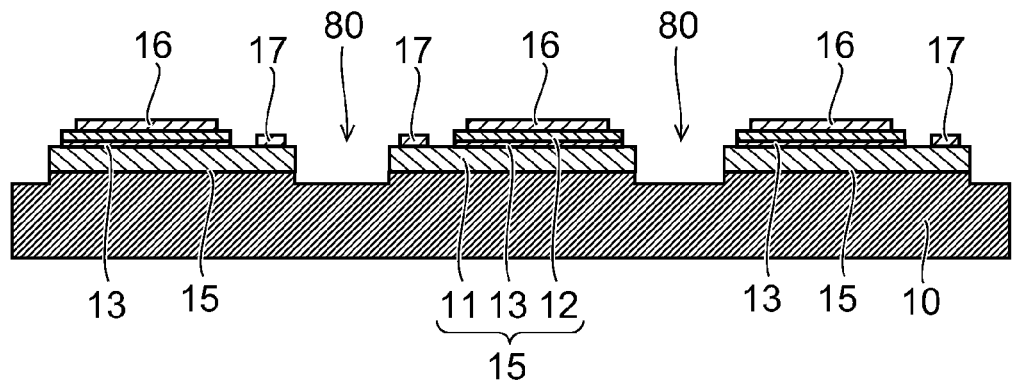
Figure 4B:
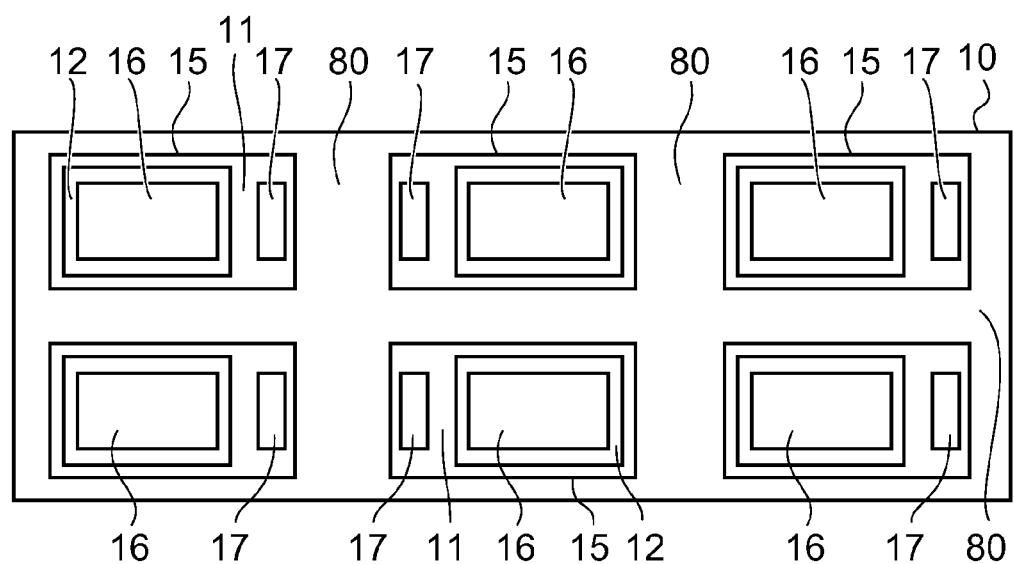

Next, as shown in FIG. 4A and FIG. 4B, the p-side electrode 16 and the n-side electrode 17 are formed on the second surface 15b of the semiconductor layer 15. FIG. 4A is a cross-sectional view, and FIG. 4B shows the upper surface of FIG. 4A.

The p-side electrode 16 is formed on the second semiconductor layer 12 (on the emitting region). The n-side electrode 17 is formed on the first semiconductor layer 11 (on the non-emitting region). The p-side electrode 16 has a larger area than the n-side electrode 17.

The p-side electrode 16 and the n-side electrode 17 are formed by, for example, the sputtering method, the vapor deposition method, or the like. Either the p-side electrode 16 or the n-side electrode 17 may be formed earlier, or both may be formed simultaneously using the same material.

The p-side electrode 16 includes a reflection film that reflects the radiated light of the light emitting layer 13. The p-side electrode 16 contains, for example, silver, a silver alloy, aluminum, an aluminum alloy, or the like. To prevent the sulfuration and oxidation of the reflection film, the p-side electrode 16 may have a configuration including a metal protection film (barrier metal). To form an ohmic contact between each electrode and the semiconductor layer, heat treatment is performed as necessary.

Figure 5A:
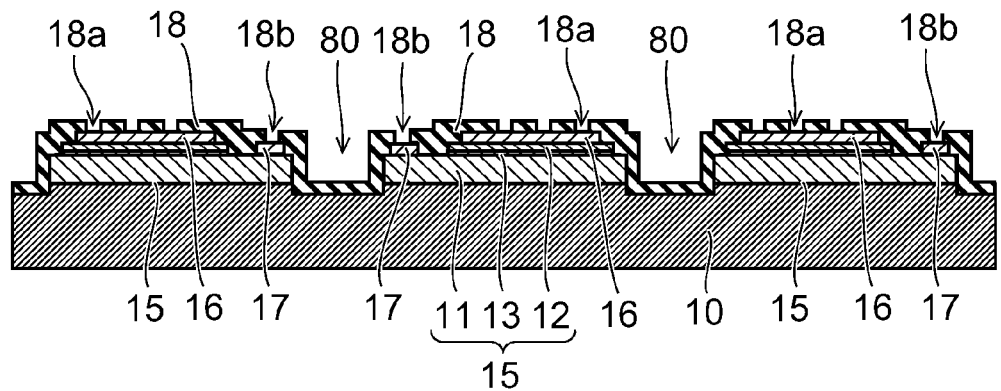

Next, as shown in FIG. 5A, the insulating film 18 is formed on the upper surface of the substrate 10. FIG. 5A is a schematic view showing a cross section of the substrate 10 and the structure on the substrate 10.

The insulating film 18 covers the structure provided on the substrate 10, and has the first opening 18a and the second opening 18b.

The insulating film 18 is, for example, a silicon oxide film or a silicon nitride film, and may be formed using the CVD (chemical vapor deposition) method. The openings 18a and 18b are formed by, for example, wet etching using a resist mask. The first opening 18a leads to the p-side electrode 16. The second opening 18b leads to the n-side electrode 17.

Also an organic film of a polyimide or the like, for example, may be used as the insulating film 18. When an organic film of a photosensitive polyimide, benzocyclobutene, or the like is used for the insulating film 18, direct exposure and development can be performed. Therefore, the patterning of the openings 18a and 18b is easy.

Figure 5B:
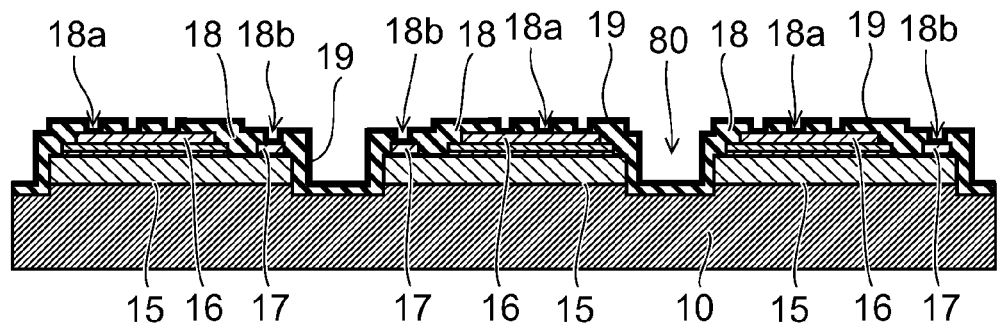
Figure 5C:
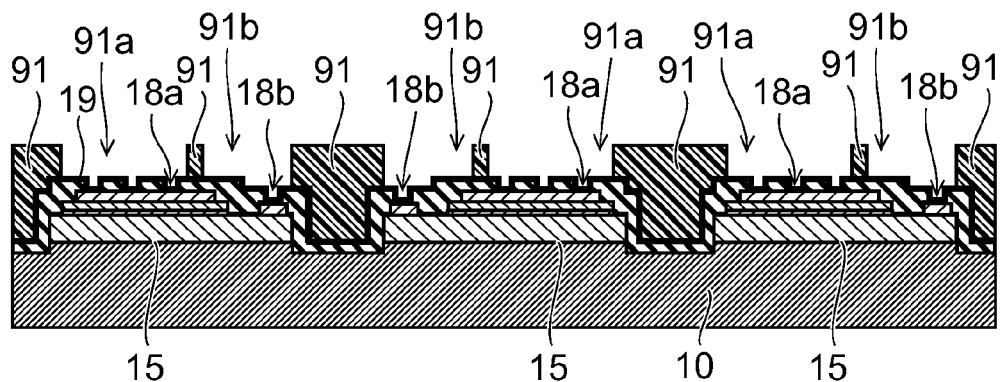
Figure 6A:
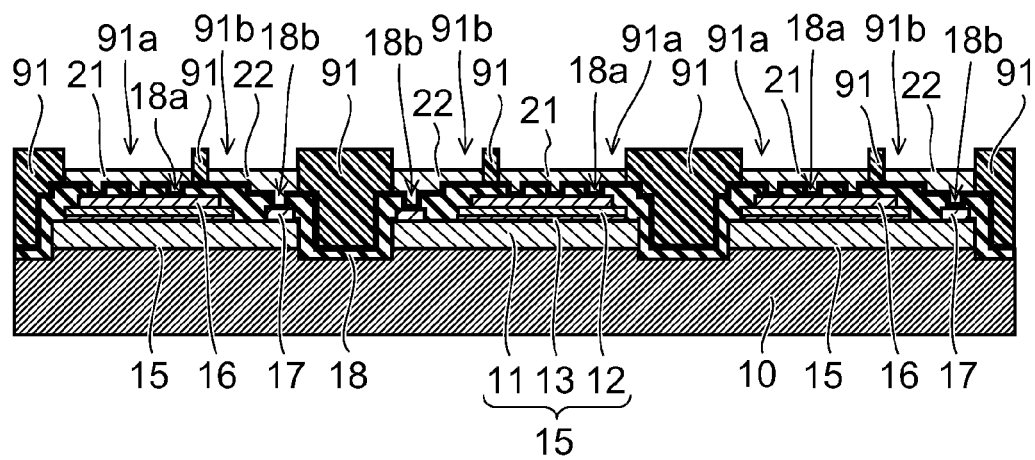
Figure 6B:
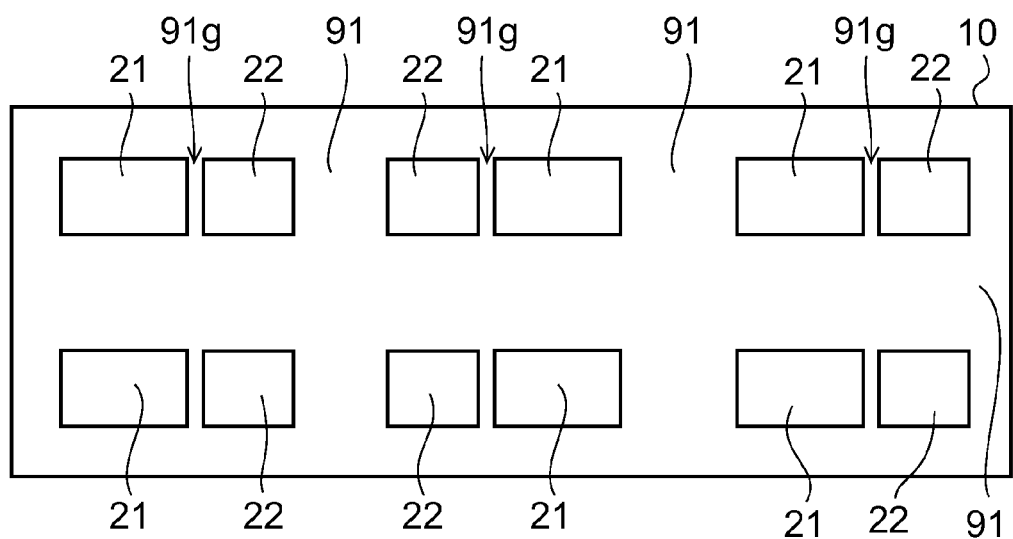

Next, FIG. 5B to FIG. 6B show the processes of forming the p-side interconnection layer 21 and the n-side interconnection layer 22. FIG. 5B to FIG. 6A are schematic views showing a cross section of the substrate 10 and the structure on the substrate 10, and FIG. 6B shows the upper surface of FIG. 6A.

As shown in FIG. 5B, a metal film 19 is formed on the surface of the insulating film 18, the inner surface (side wall and bottom surface) of the first opening 18a, and the inner surface (side wall and bottom surface) of the second opening 18b. The metal film 19 functions as a seed metal in the plating process.

The metal film 19 is formed by, for example, the sputtering method. The metal film 19 includes, for example, a titanium (Ti) film and a copper (Cu) film formed in this order from the insulating film 18 side. An aluminum film may be used in place of the titanium film.

Depending on the material and manufacturing method of the metal film 19, after used as a seed of plating, the material may not exist as the metal film 19 by being integrated with interconnection layers or the like. Depending on the method for manufacturing interconnection layers, the metal film 19 may not be formed.

Next, as shown in FIG. 5C, a resist mask 91 is formed on the metal film 19. The resist mask 91 includes an opening 91a and an opening 91b. The opening 91a is formed on the p-side electrode 16, and the opening 91b is formed on the n-side electrode 17.

Subsequently, as shown in FIG. 6A and FIG. 6B, the p-side interconnection layer 21 and the n-side interconnection layer 22 are formed by electrolytic copper plating. That is, using the metal film 19 as a current path, a copper (Cu) layer is selectively formed in the openings 91a and 91b of the resist mask 91.

As shown in FIG. 6A, the p-side interconnection layer 21 is formed on the insulating film 18 and in the first opening 18a. The p-side interconnection layer 21 is electrically connected to the p-side electrode 16. The n-side interconnection layer 22 is formed on the insulating film 18 and in the second opening 18b. The n-side interconnection layer 22 is electrically connected to the n-side electrode 17.

As shown in FIG. 6B, the p-side interconnection layer 21 and the n-side interconnection layer 22 face each other across a resist mask 91g. That is, the spacing between the p-side interconnection layer 21 and the n-side interconnection layer 22 can be made narrow up to the limit of photolithography.

Figure 7A:
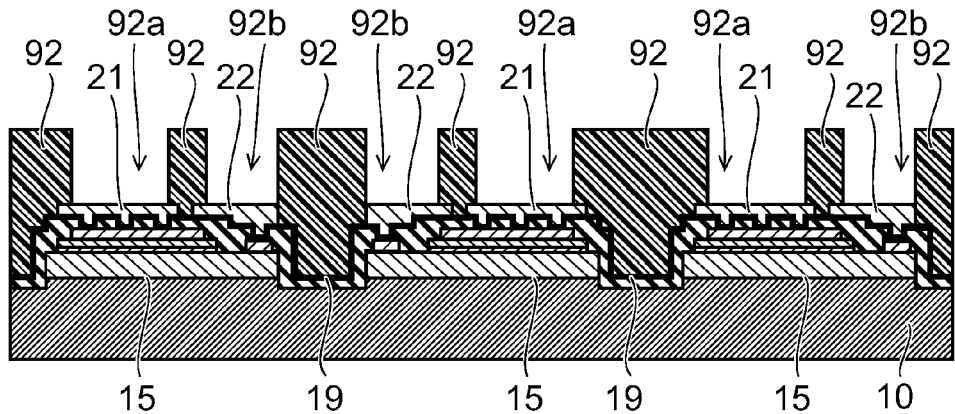
Figure 7B:
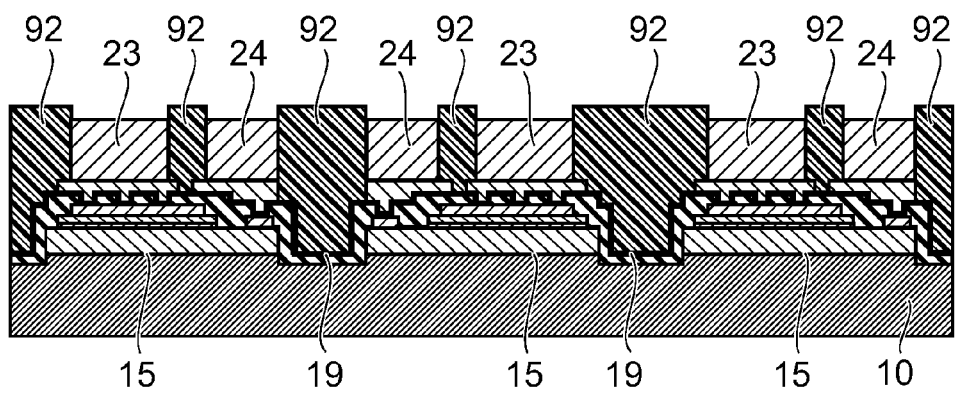
Figure 7C:
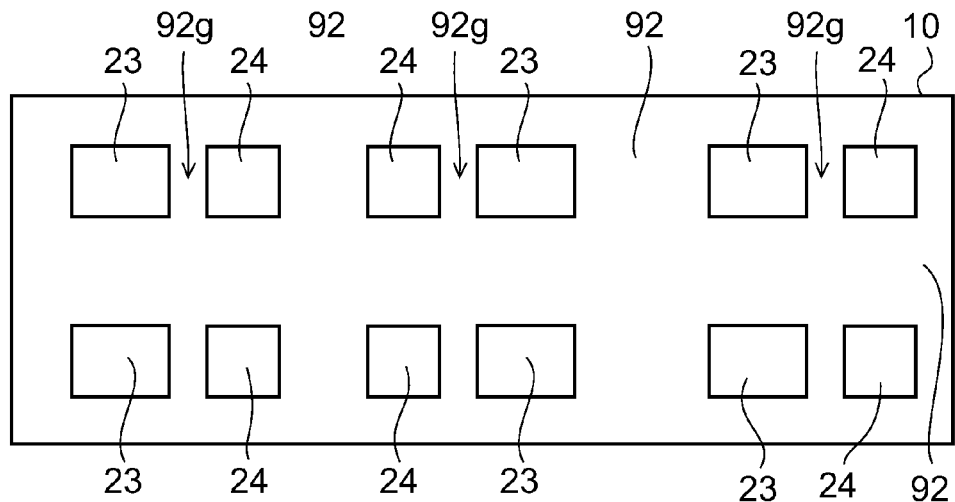

Next, FIG. 7A to FIG. 7C show the processes of forming the p-side metal pillar 23 and the n-side metal pillar 24. FIG. 7A and FIG. 7B are schematic views showing a cross section of the substrate 10 and the structure on the substrate 10, and FIG. 7C shows the upper surface of FIG. 7B.

As shown in FIG. 7A, a resist mask 92 having an opening 92a and an opening 92b is formed. For example, after the resist mask 91 used in the previous process is removed using a solvent or oxygen plasma, photolithography is used to newly form the resist mask 92. The resist mask 92 may also be formed to be stacked on the resist mask 91.

Subsequently, as shown in FIG. 7B, the p-side metal pillar 23 and the n-side metal pillar 24 are formed in the openings 92a and 92b, respectively. The p-side metal pillar 23 and the n-side metal pillar 24 are formed using, for example, electrolytic Cu plating.

As shown in FIG. 7C, the p-side metal pillar 23 and the n-side metal pillar 24 face each other across a resist mask 92g. The spacing between the p-side metal pillar 23 and the n-side metal pillar 24 is made wider than the spacing between the p-side interconnection layer 21 and the n-side interconnection layer 22 in order to prevent a short circuit during mounting.

Figure 8A:
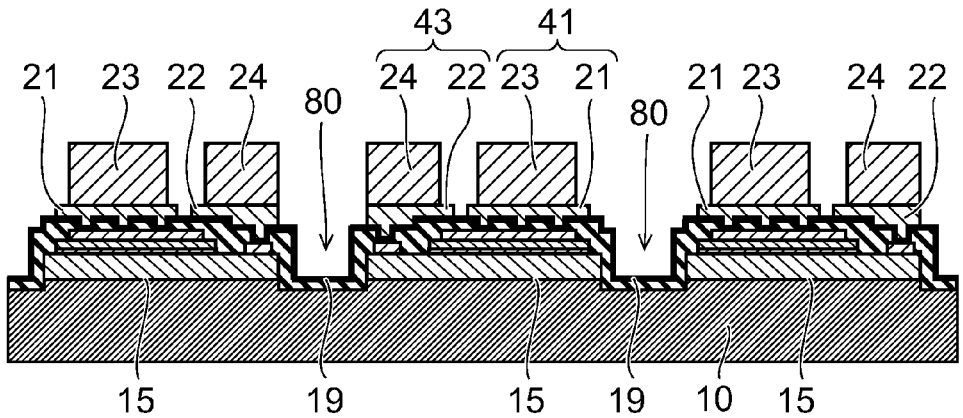
Figure 8B:
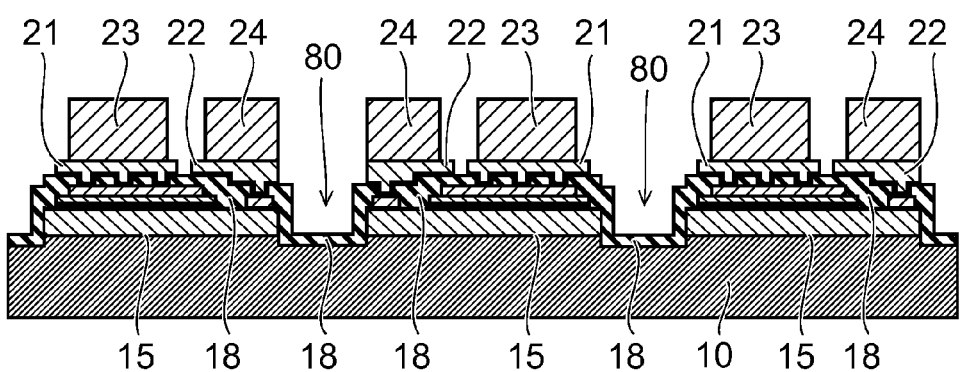
Figure 8C:
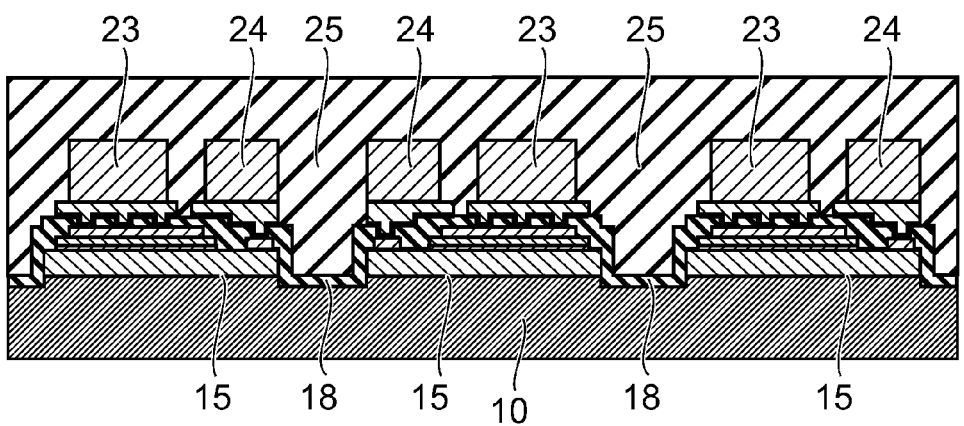

FIG. 8A to FIG. 8C are schematic cross-sectional views showing processes continuing from FIG. 7B and FIG. 7C.

As shown in FIG. 8A, the resist mask 92 is removed using, for example, a solvent or oxygen plasma. Subsequently, as shown in FIG. 8B, the exposed portion of the metal film 19 is removed by wet etching using the metal pillar 23, the n-side metal pillar 24, the p-side interconnection layer 21, and the n-side interconnection layer 22 as a mask. Thereby, the electrical connection between the p-side interconnection layer 21 and the n-side interconnection layer 22 is cut off.

Next, as shown in FIG. 8C, the insulating film 25 is stacked as the second insulating film on the insulating film 18. The insulating film 25 covers the p-side interconnection layer 21, the n-side interconnection layer 22, the p-side metal pillar 23, and the n-side metal pillar 24.

The insulating film 25 insulates the p-side interconnection unit 41 including the p-side interconnection layer 21 and the p-side metal pillar 23 and the n-side interconnection unit 43 including the n-side interconnection layer 22 and the n-side metal pillar 24. The insulating film 25 contains, for example, carbon black, and blocks the radiated light of the light emitting layer 13. The insulating film 25 may include, for example, a member that reflects the radiated light of the light emitting layer 13, such as titanium oxide.

Next, as shown in FIG. 9A to FIG. 11B, the processing of the first surface 15a side of the semiconductor layer 15 is performed. FIG. 9A to FIG. 11B are schematic cross-sectional views showing the processes.

Figure 9A:
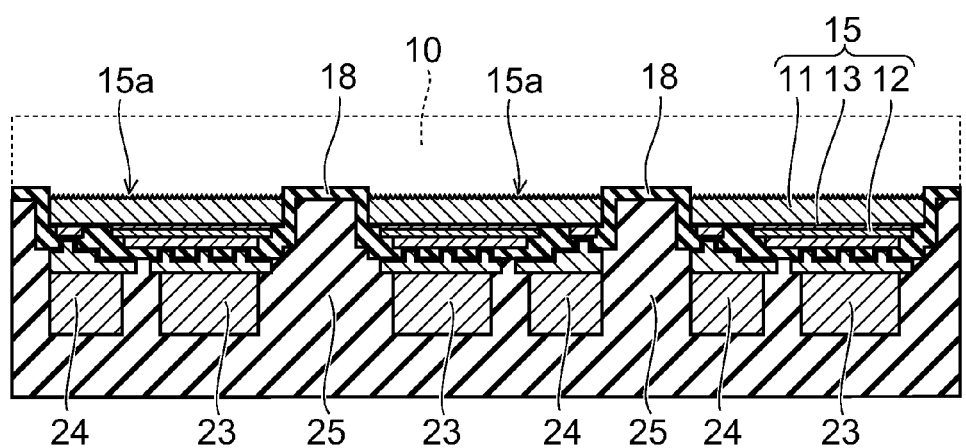

As shown in FIG. 9A, the substrate 10 is removed from the semiconductor layer 15. In the case where the substrate 10 is a silicon substrate, for example, the substrate 10 can be selectively removed by wet etching. In the case where the substrate 10 is a sapphire substrate, for example, the substrate 10 can be removed using the laser lift-off method.

The substrate 10 is removed in a state where the light emitting element including the semiconductor layer 15, the p-side electrode 16, and the n-side electrode 17 is supported by the support body including the p-side metal pillar 23, the n-side metal pillar 24, and the insulating film 25. The light emitting element still keeps the state of being supported by the support body including the p-side metal pillar 23, the n-side metal pillar 24, and the insulating film 25 after the substrate 10 is removed.

The semiconductor layer 15 epitaxially grown on the substrate 10 may include a large internal stress. The p-side metal pillar 23, the n-side metal pillar 24, and the insulating film 25 are materials more flexible than the semiconductor layer 15 of, for example, a GaN-based material. Therefore, even when the internal stress due to the epitaxial growth is released at once during the peeling of the substrate 10, the p-side metal pillar 23, the n-side metal pillar 24, and the insulating film 25 absorb the stress. Therefore, damage to the semiconductor layer 15 in the process of removing the substrate 10 can be avoided.

After the substrate 10 is removed, fine unevenness is formed on the first surface 15a of the semiconductor layer 15. For example, the first surface 15a is wet-etched with a KOH (potassium hydroxide) aqueous solution, TMAH (tetramethylammonium hydroxide), or the like. In this etching, a difference in the etching rate depending on the crystal plane direction occurs. Consequently, as shown in FIG. 9A, unevenness can be formed on the first surface 15a. It is also possible to form a resist mask on the first surface 15a to selectively etch the first surface 15a. By forming unevenness on the first surface 15a, the extraction efficiency of the radiated light of the light emitting layer 13 can be improved.

Figure 9B:
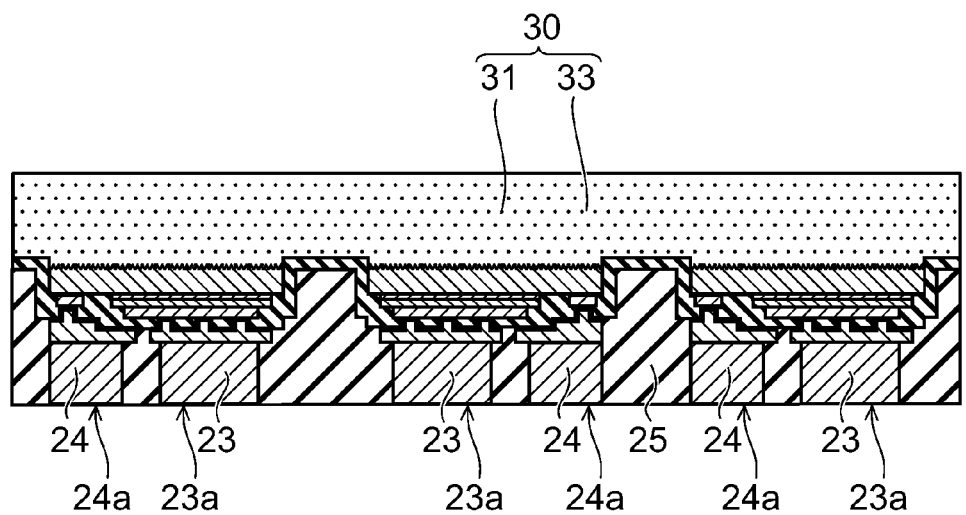

Next, as shown in FIG. 9B, the fluorescent material layer 30 is formed on the first surface 15a. The fluorescent material layer 30 contains fluorescent materials 31 and the first bonding material 33, and is formed by, for example, a method such as printing, potting, molding, and compression molding.

As the fluorescent material layer 30, also a sintered fluorescent material formed by sintering fluorescent materials 31 via the first bonding material 33 may be attached to the first surface 15a. For example, an adhesive (a bonding layer) containing an epoxy resin or the like is applied to the first surface 15a, and a plate containing sintered fluorescent materials 31 is pressure-bonded to the bonding layer. Thereby, the fluorescent material layer 30 is attached to the first surface 15a via the bonding layer.

The fluorescent material 31 is, for example, a yellow fluorescent material that emits yellow light, a red fluorescent material that emits red light, and/or a green fluorescent material that emits green light, by being excited by the radiated light of the light emitting layer 13 (excitation light). The fluorescent material layer 30 may contain a plurality of kinds of fluorescent substances.

The first bonding material 33 is, for example, a resin such as a silicone resin, an acrylic resin, and a phenyl resin. Also a glass material may be used as the first bonding material 33.

Figure 10A:
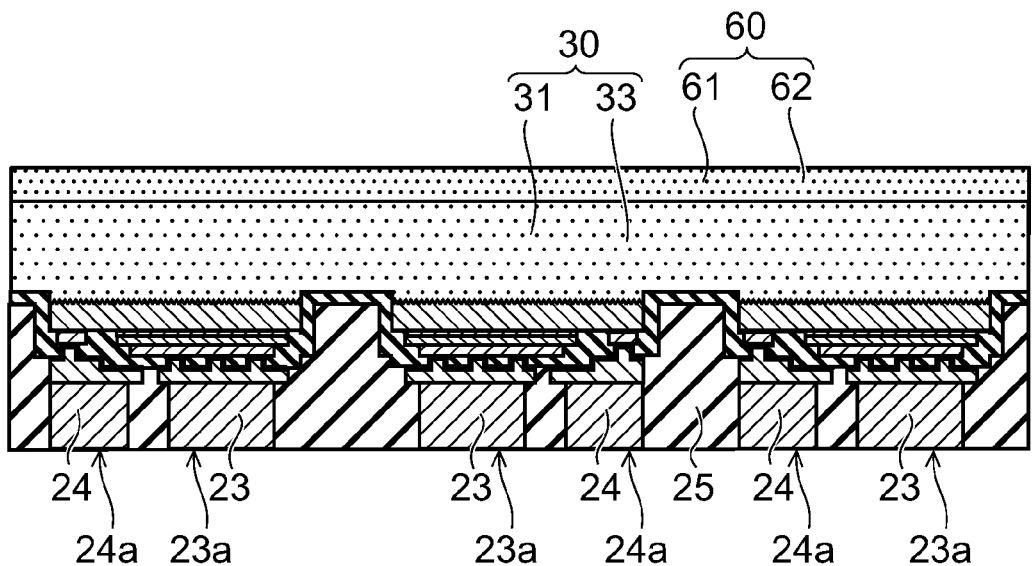

As shown in FIG. 10A, the scattering layer 60 is formed on the fluorescent material layer 30. The upper surface of the fluorescent material layer 30 is made flat by, for example, grinding, and the scattering layer 60 is formed on the flat surface. The scattering layer 60 is in contact with the upper surface of the fluorescent material layer 30.

The scattering layer 60 contains the second bonding material 62, and a plurality of scattering materials 61 are scattered in the second bonding material 62.

As the second bonding material 62, for example, a silicone resin and an acrylic resin may be used. The scattering material 61 is made of a material having a different refractive index from the second bonding material 62, and is, for example, silica, alumina, hollow nanosilica, or a pore.

The size of the fluorescent material 31 is in the order of micrometer, and the size of the scattering material 61 is smaller than the size of the fluorescent material 31 and is in the order of nanometer not more than 1 μm. The film thickness of the fluorescent material layer 30 is, for example, 100 to 200 μm, and is thicker than the film thickness of the scattering layer 60.

The surface (the lower surface in FIG. 10A) of the insulating film 25 is ground to expose the p-side metal pillar 23 and the n-side metal pillar 24. The exposed surface of the p-side metal pillar 23 forms the p-side external terminal 23a, and the exposed surface of the n-side metal pillar 24 forms the n-side external terminal 24a.

In the embodiment, after the scattering layer 60 is formed, the measurement of optical characteristics and the adjustment of the in-wafer-plane distribution of the coverage of the scattering layer 60 to the upper surface of the fluorescent material layer 30 in accordance with the optical characteristics are performed on a wafer level.

For example, a probe is brought into contact with the p-side external terminal 23a and the n-side external terminal 24a, and a current is supplied to the light emitting layer 13 to cause the light emitting layer 13 to emit light. Then, optical characteristics of the light emitted from the scattering layer 60 side to the outside are measured. Here, the optical characteristics are the in-wafer-plane distribution of the peak wavelength, emission spectrum, or chromaticity of the light emitting layer 13, etc.

The in-wafer-plane distribution of the coverage of the scattering layer 60 to the upper surface of the fluorescent material layer 30 is adjusted in accordance with the in-wafer-plane distribution of the peak wavelength, emission spectrum, or chromaticity of the light emitting layer 13.

After formed on the entire upper surface of the fluorescent material layer 30, the scattering layer 60 is selectively removed. Thereby, the area of the scattering layer 60 left on the upper surface of the fluorescent material layer 30, that is, the coverage of the scattering layer 60 covering the upper surface of the fluorescent material layer 30 is adjusted.

Figure 10B:
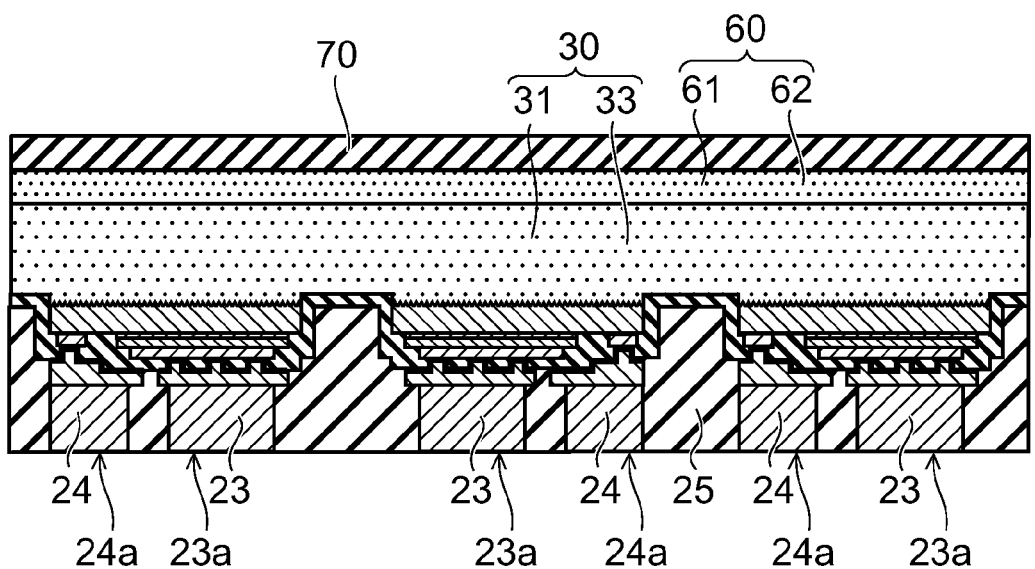

Specifically, as shown in FIG. 10B, a resist film 70 is formed on the scattering layer 60. The resist film 70 is exposed to light by selectively irradiating the resist film 70 with laser light.

The resist film 70 is selectively scan-exposed to light with a laser without using a mask (reticle), in a wafer state. The resist film 70 is partially exposed to light and reacts photosensitively. The in-wafer-plane distribution of the exposure portion (or the non-exposure portion) is set in accordance with the in-wafer-plane distribution of the peak wavelength, emission spectrum, or chromaticity of the light emitting layer 13 obtained by the measurement of optical characteristics mentioned above.

Figure 11A:
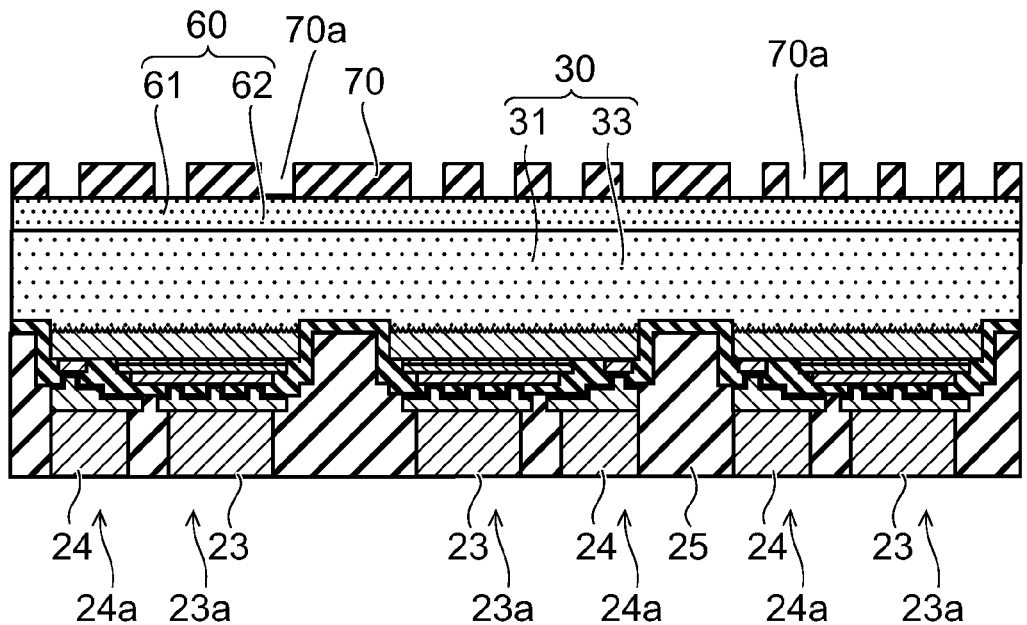

After the exposure, the resist film 70 is developed to form a plurality of openings 70a in the resist film 70 as shown in FIG. 11A. The in-wafer-plane distribution of the opening ratio of the resist film 70 is set in accordance with the in-wafer-plane distribution of the peak wavelength, emission spectrum, or chromaticity of the light emitting layer 13 obtained by the measurement of optical characteristics mentioned above.

Figure 11B:
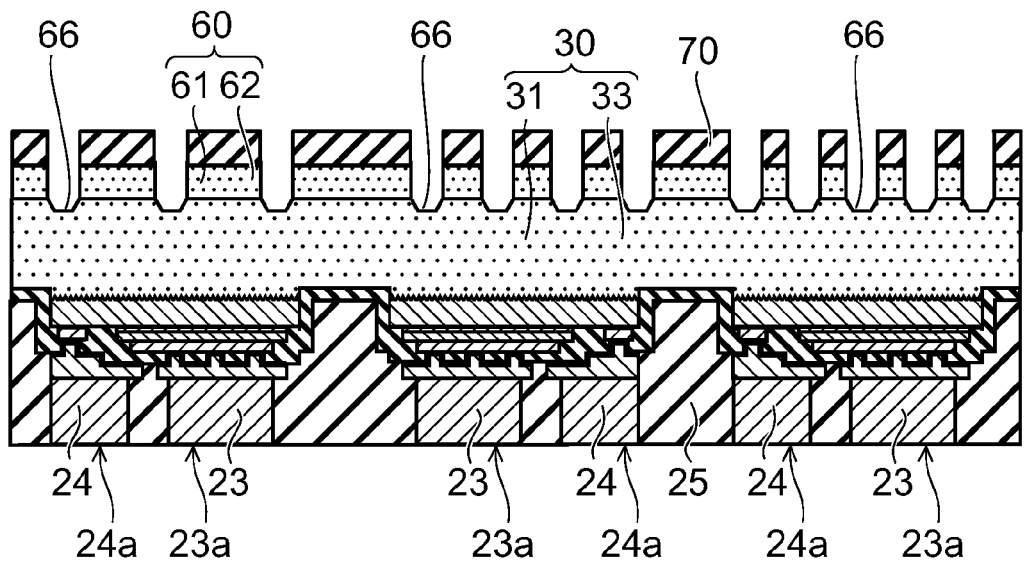

Then, as shown in FIG. 11B, the resist film 70 in which the opening 70a is formed is used as a mask to perform etching (e.g. RIE) to selectively remove the scattering layer 60.

When the scattering layer 60 is etched, also the upper surface of the fluorescent material layer 30 exposed by the removal of the scattering layer 60 is etched. The portion of the upper surface of the fluorescent material layer 30 where the scattering layer 60 is not provided is more recessed than the portion where the scattering layer 60 is provided.

Recesses 66 are partially formed in the upper surface of the fluorescent material layer 30, and the light extraction area in the upper surface of the fluorescent material layer 30 is increased; thus, the light extraction efficiency can be improved.

Figure 13:
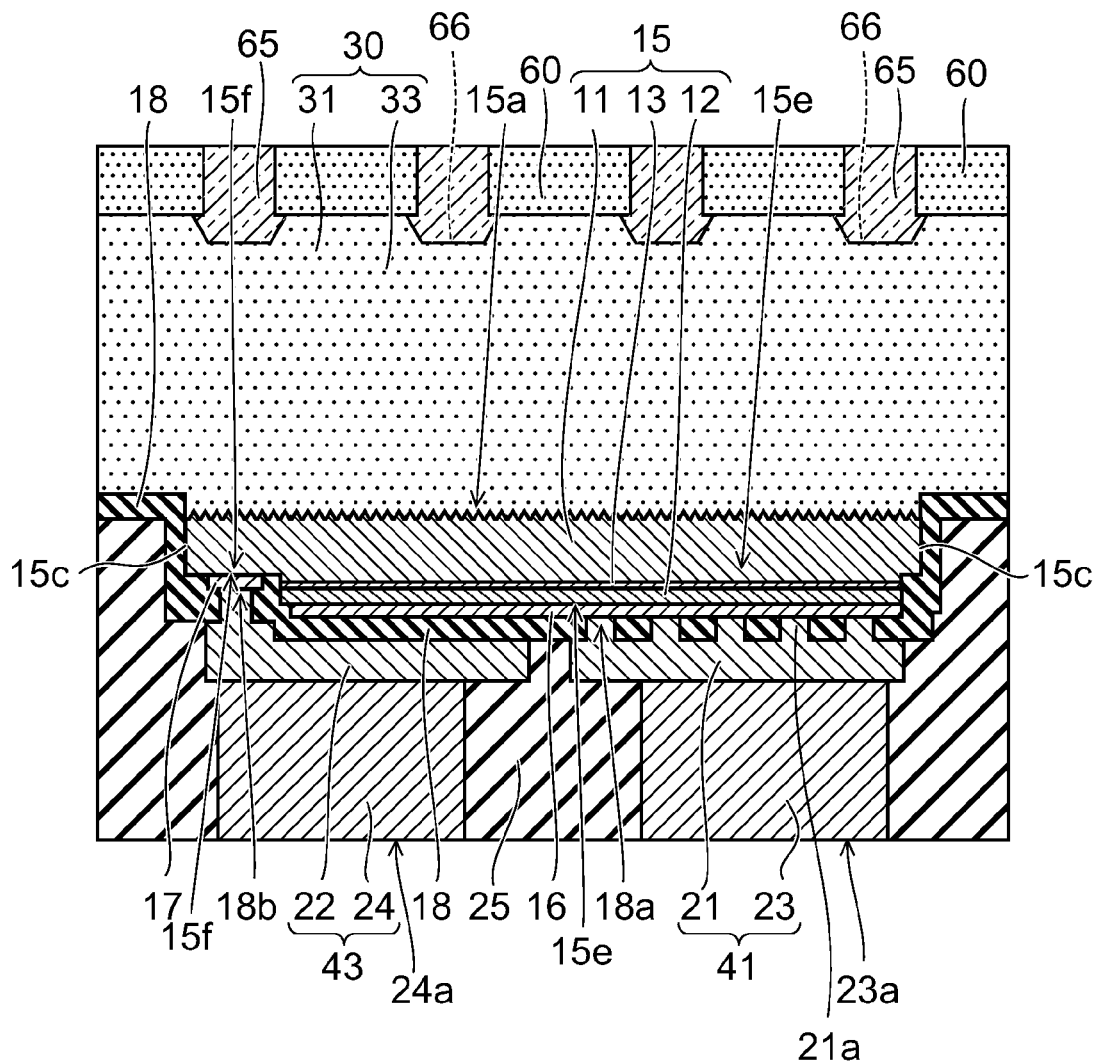
FIG. 13 is a schematic cross-sectional view of a variation of the semiconductor light emitting device of the first embodiment.

Although FIG. 11B shows a configuration of a tapered shape for the side wall of the recess 66, the cross-sectional shape of the recess 66 may be a rectangular shape. The side wall and bottom of the recess 66 may be a curved surface shape. As shown in FIG. 13, also a structure in which the edge of the scattering layer 60 protrudes in an eaves shape further to the inside of the recess 66 than the opening edge of the recess 66 is possible.

In the region where the optical measurement shows that the peak wavelength or chromaticity of the light emitting layer 13 is relatively shifted to the excitation light side (e.g. the blue side), the coverage of the scattering layer 60 is made relatively high.

In the region where the coverage of the scattering layer 60 is relatively high, the amount of excitation light scattered and reflected to the fluorescent material layer 30 side is large, and the chromaticity of light emitted to the outside can be corrected to the fluorescent material color side.

Thus, by adjusting the in-wafer-plane distribution of the coverage of the scattering layer 60, the in-wafer-plane distribution of the chromaticity of light emitted to the outside can be equalized, and what is called color breakup in which the chromaticity varies with the angle of viewing can be suppressed.

The adjustment of the coverage of the scattering layer 60 containing the scattering material 61 of nanometer order with a smaller size than the fluorescent material 31 of micrometer order more enables fine adjustments of chromaticity than the film thickness adjustment of the fluorescent material layer 30.

The coverage of the scattering layer 60 can be finely adjusted with high accuracy by lithography using the resist film 70. Therefore, the adjustment of the coverage of the scattering layer 60 more enables high accuracy fine adjustments of chromaticity than the film thickness adjustment of the scattering layer 60 using grinding.

In the embodiment, since the chromaticity distribution is adjusted by the coverage adjustment of the scattering layer 60, there is no need to form the fluorescent material layer 30 with a thick film thickness in view of the adjustment amount. Thus, by reducing the film thickness of the fluorescent material layer 30, cost reduction and height reduction can be achieved. Furthermore, by reducing the film thickness of the fluorescent material layer 30, the directivity of outwardly emitted light can be narrowed.

Figure 12A:
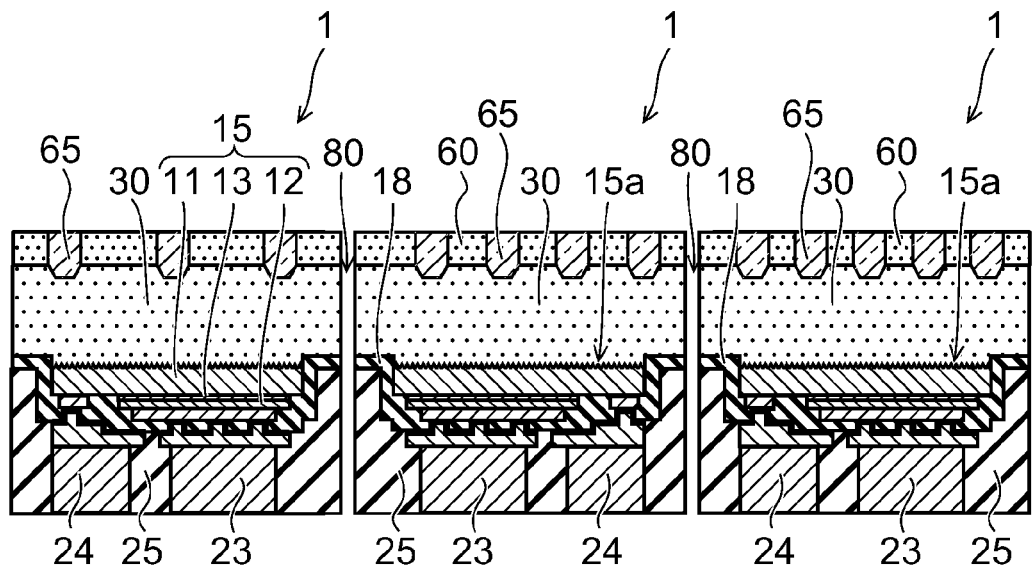
Figure 12B:
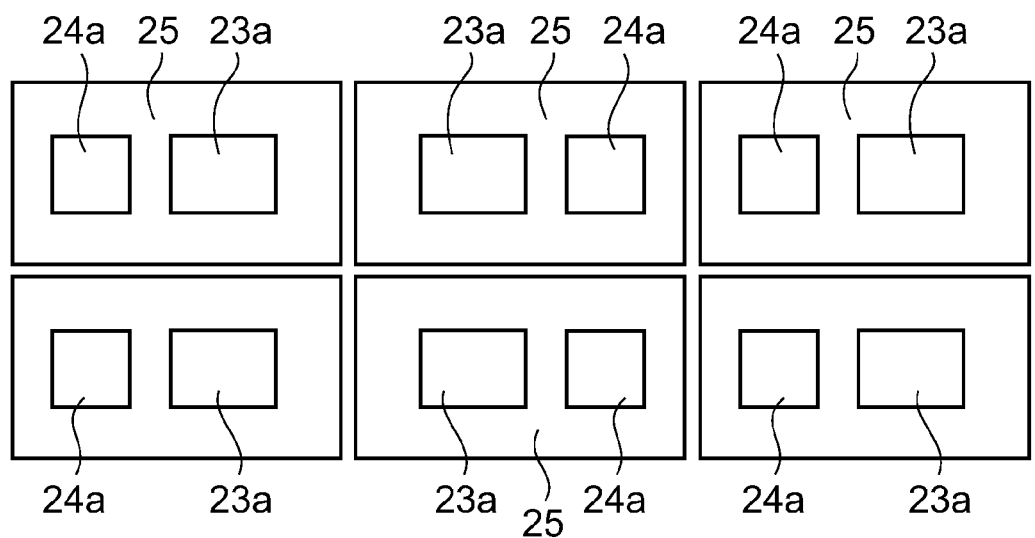

After the scattering layer 60 is selectively etched, the resist film 70 is removed. Then, as shown in FIG. 12A and FIG. 12B, the scattering layer 60, the fluorescent material layer 30, the insulating film 18, and the insulating film 25 are cut at the position of the dicing region, which is the region between adjacent semiconductor layers 15. The cutting of the scattering layer 60, the fluorescent material layer 30, the insulating film 18, and the insulating film 25 is performed using, for example, a dicing blade. The cutting may be performed also by laser irradiation. In the case where the transparent material 65 is provided on the dicing region, also the transparent material 65 is cut.

The wafer is singulated as the semiconductor light emitting device 1 including at least one semiconductor layer 15. FIG. 12A shows cross sections of semiconductor light emitting devices 1, and FIG. 12B shows the lower surface of FIG. 12A and shows the mounting surface of the semiconductor light emitting device 1 at which the p-side external terminal 23a and the n-side external terminal 24a are exposed.

The semiconductor layer 15 does not exist in the dicing region, and is therefore free from damage caused by dicing. On being singulated, a structure in which the side surface of the semiconductor layer 15 is covered and protected by the insulating film 18 is obtained.

The semiconductor light emitting device 1 may be a single-chip structure including one semiconductor layer 15, or may be a multi-chip structure including a plurality of semiconductor layers 15.

Since the processes before dicing are performed collectively in a wafer state, there is no need to perform wiring and packaging for each singulated device, and a significant cost reduction is possible. That is, at the stage of being singulated, wiring and packaging have already been performed. Therefore, the embodiment can enhance productivity and can reduce manufacturing costs.

Since the fluorescent material layer 30 and the scattering layer 60 are formed in a wafer state, the fluorescent material layer 30 and the scattering layer 60 are limited to on the first surface 15a of the semiconductor layer 15 and on the support body, and are not formed to go round to the second surface of the semiconductor layer 15 and the side surface of the support body.

Since the support body, the fluorescent material layer 30, and the scattering layer 60 are cut after they are formed in a wafer state, the side surface of the scattering layer 60, the side surface of the fluorescent material layer 30, and the side surface of the insulating film 25 forming the side surface of the support body form the side surface of the semiconductor light emitting device 1 singulated.

Therefore, the side surface of the scattering layer 60, the side surface of the fluorescent material layer 30, and the side surface of the insulating film 25 are even with each other, and a small-sized semiconductor light emitting device 1 of a chip size package structure can be provided.

Second Embodiment

Figure 14:
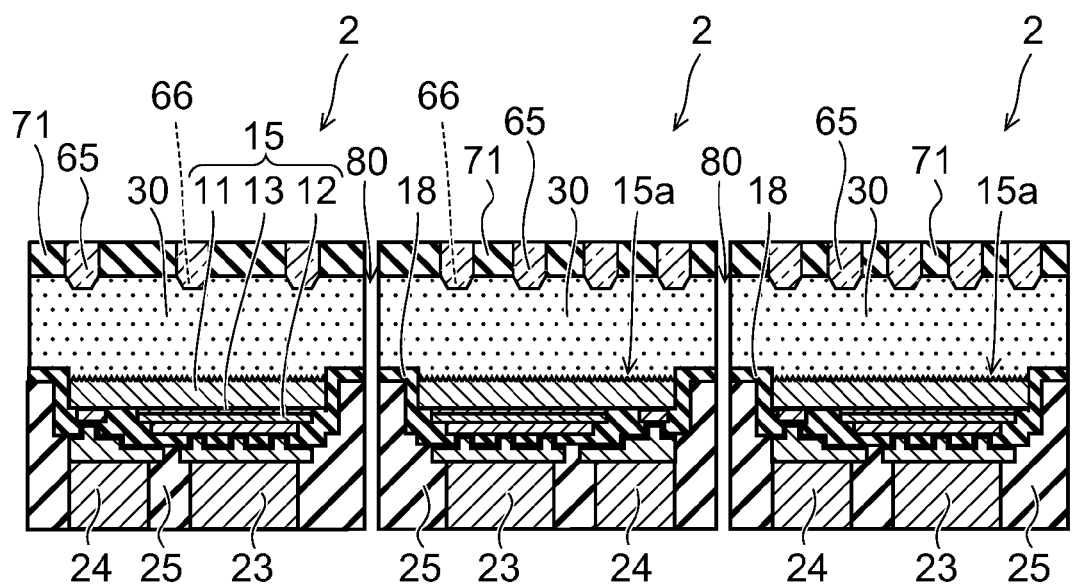
FIG. 14 is a schematic cross-sectional view of a semiconductor light emitting device of a second embodiment.

FIG. 14 is a schematic cross-sectional view of a semiconductor light emitting device 2 of a second embodiment.

FIG. 14 shows, for example, three semiconductor light emitting devices 2 diced from the wafer state.

In the second embodiment, a dielectric film 71 is provided as the reflection film on the upper surface of the fluorescent material layer 30. Otherwise, the configuration is similar to the semiconductor light emitting device 1 of the first embodiment.

The dielectric film 71 has a different refractive index from the first bonding material 33 of the fluorescent material layer 30, and is, for example, a silicon nitride film. The dielectric film 71 has reflection properties dependent on the wavelength, has a film thickness of, for example, ½ of the wavelength (peak wavelength) of the radiated light of the light emitting layer 13 (excitation light), and selectively reflects the radiated light of the light emitting layer 13 (excitation light).

That is, the reflectance at the dielectric film 71 of the radiated light of the light emitting layer 13 (excitation light) is higher than the reflectance at the dielectric film 71 of the radiated light of the fluorescent material 31.

By reflecting the excitation light at the dielectric film 71 in a larger amount than the radiated light of the fluorescent material, the difference in the luminance distribution to the light output angle between the excitation light and the radiated light of the fluorescent material can be adjusted, and color breakup can be suppressed.

The dielectric film 71 is partially provided on the upper surface of the fluorescent material layer 30. The dielectric film 71 is provided on the upper surface of the fluorescent material layer 30 in a planar pattern of, for example, an island configuration, a line configuration, a lattice configuration, or the like.

The transparent material 65 is provided on the upper surface of the fluorescent material layer 30 where the dielectric film 71 is not provided. The transparent material 65 is put in between a dielectric film 71 and a dielectric film 71 partially provided on the upper surface of the fluorescent material layer 30.

The processes up to removing the substrate and forming the fluorescent material layer 30 on the first surface 15a of the semiconductor layer 15 are performed in a similar way to the first embodiment.

The dielectric film 71 is formed on the entire upper surface of the fluorescent material layer 30. Then, the measurement of optical characteristics similar to the first embodiment is made, and the dielectric film 71 is selectively removed. Thereby, the area of the dielectric film 71 left on the upper surface of the fluorescent material layer 30, that is, the coverage of the dielectric film 71 covering the upper surface of the fluorescent material layer 30 is adjusted.

Specifically, a resist film is formed on the dielectric film 71 similarly to the first embodiment. The resist film is exposed to light by selectively irradiating the resist film with laser light.

The resist film is selectively scan-exposed to light with a laser without using a mask (reticle), in a wafer state. Then, similarly to the first embodiment, the in-wafer-plane distribution of the exposure portion (or the non-exposure portion) is set in accordance with the in-wafer-plane distribution of the peak wavelength, emission spectrum, or chromaticity of the light emitting layer 13 obtained by the measurement of optical characteristics of the light emitted from the dielectric film 71 side.

After the exposure, the resist film is developed to form a plurality of openings in the resist film. The in-wafer-plane distribution of the opening ratio of the resist film is set in accordance with the in-wafer-plane distribution of the peak wavelength, emission spectrum, or chromaticity of the light emitting layer 13 obtained by the measurement of optical characteristics mentioned above.

Then, the resist film in which the opening is formed is used as a mask to perform etching (e.g. RIE) to selectively remove the dielectric film 71.

When the dielectric film 71 is etched, also the upper surface of the fluorescent material layer 30 exposed by the removal of the dielectric film 71 is etched. The portion of the upper surface of the fluorescent material layer 30 where the dielectric film 71 is not provided is more recessed than the portion where the dielectric film 71 is provided.

Recesses 66 are partially formed in the upper surface of the fluorescent material layer 30, and the light extraction area in the upper surface of the fluorescent material layer 30 is increased; thus, the light extraction efficiency can be improved.

In the region where the optical measurement mentioned above shows that the peak wavelength or chromaticity of the light emitting layer 13 is relatively shifted to the excitation light side (e.g. the blue side), the coverage of the dielectric film 71 is made relatively high.

In the region where the coverage of the dielectric film 71 is relatively high, the amount of excitation light scattered and reflected to the fluorescent material layer 30 side is large, and the chromaticity of light emitted to the outside can be corrected to the fluorescent material color side.

Thus, by adjusting the in-wafer-plane distribution of the coverage of the dielectric film 71, the in-wafer-plane distribution of the chromaticity of light emitted to the outside can be equalized, and what is called color breakup in which the chromaticity varies with the angle of viewing can be suppressed.

The coverage of the dielectric film 71 can be finely adjusted with high accuracy by lithography using a resist film. Therefore, the adjustment of the coverage of the dielectric film 71 more enables high accuracy fine adjustments of chromaticity than the film thickness adjustment of the scattering layer 60 using grinding.

Third Embodiment

Figure 15A:
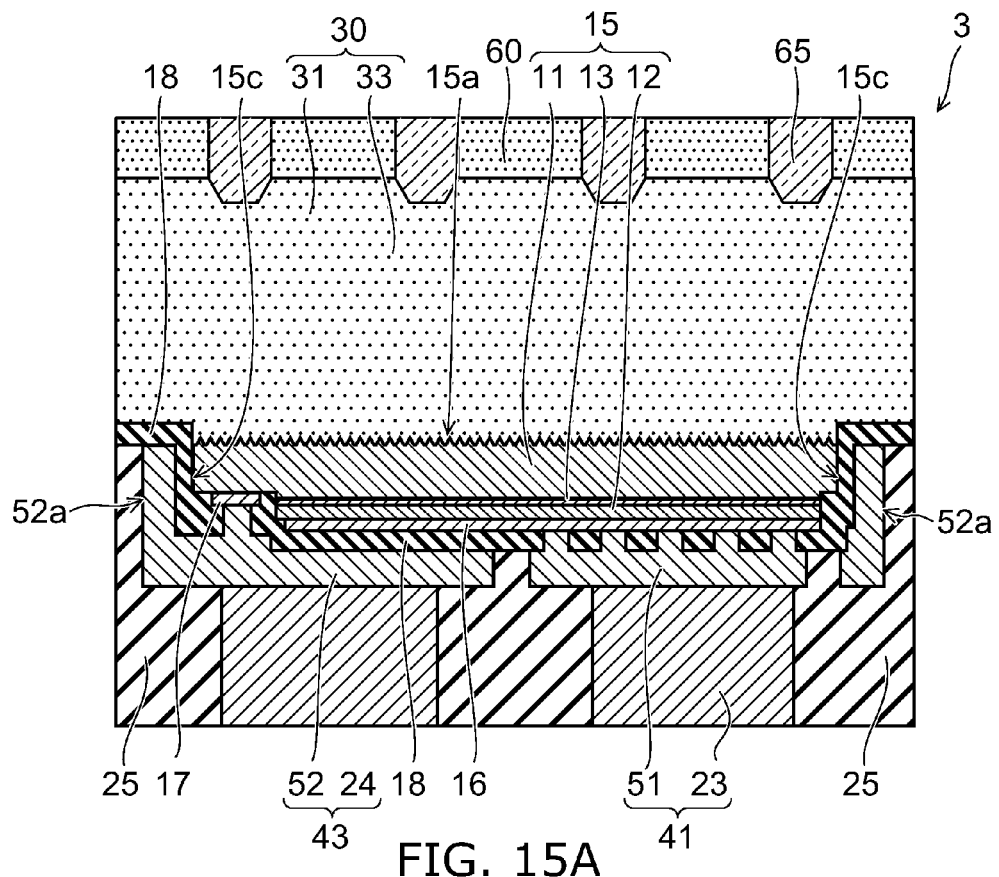
FIGS. 15A and 15B are schematic views of a semiconductor light emitting device of a third embodiment.
Figure 15B:
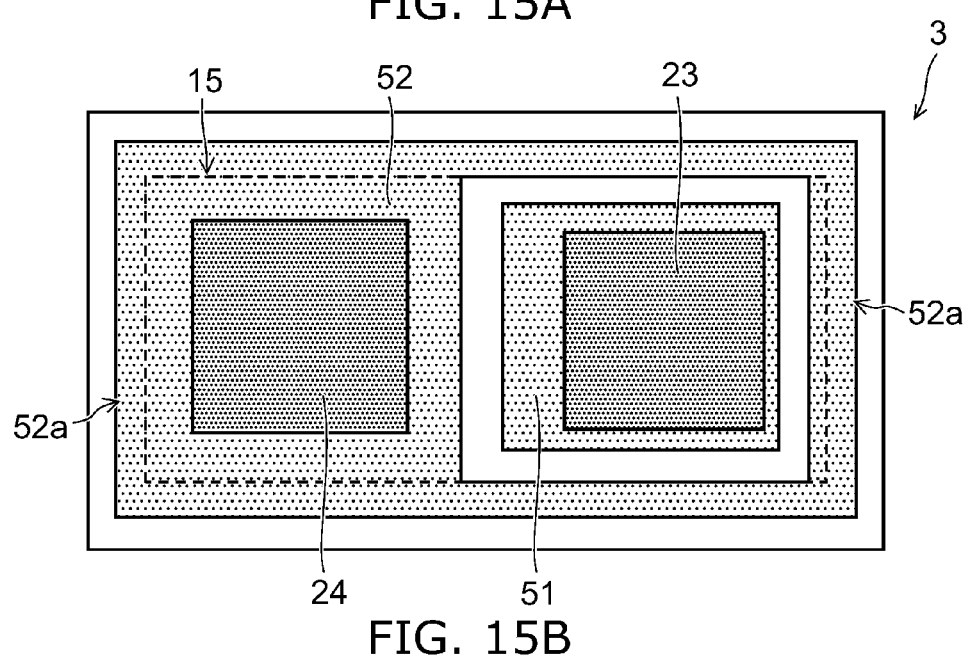

FIGS. 15A and 15B are schematic views showing a semiconductor light emitting device 3 of a third embodiment.

FIG. 15A shows a cross section of the semiconductor light emitting device 3.

FIG. 15B is a plan view showing the arrangement of the p-side interconnection unit 41 and the n-side interconnection unit 43 as viewed from the second surface side of the semiconductor layer 15.

In the semiconductor light emitting device 3 of the third embodiment, a p-side interconnection layer 51 corresponds to the p-side interconnection layer 21 of the embodiments described above, and the p-side interconnection unit 41 includes the p-side interconnection layer 51 and the p-side metal pillar 23. In the semiconductor light emitting device 3 of the third embodiment, an n-side interconnection layer 52 corresponds to the n-side interconnection layer 22 of the embodiments described above, and the n-side interconnection unit 43 includes the n-side interconnection layer 52 and the n-side metal pillar 24.

Figure 17:
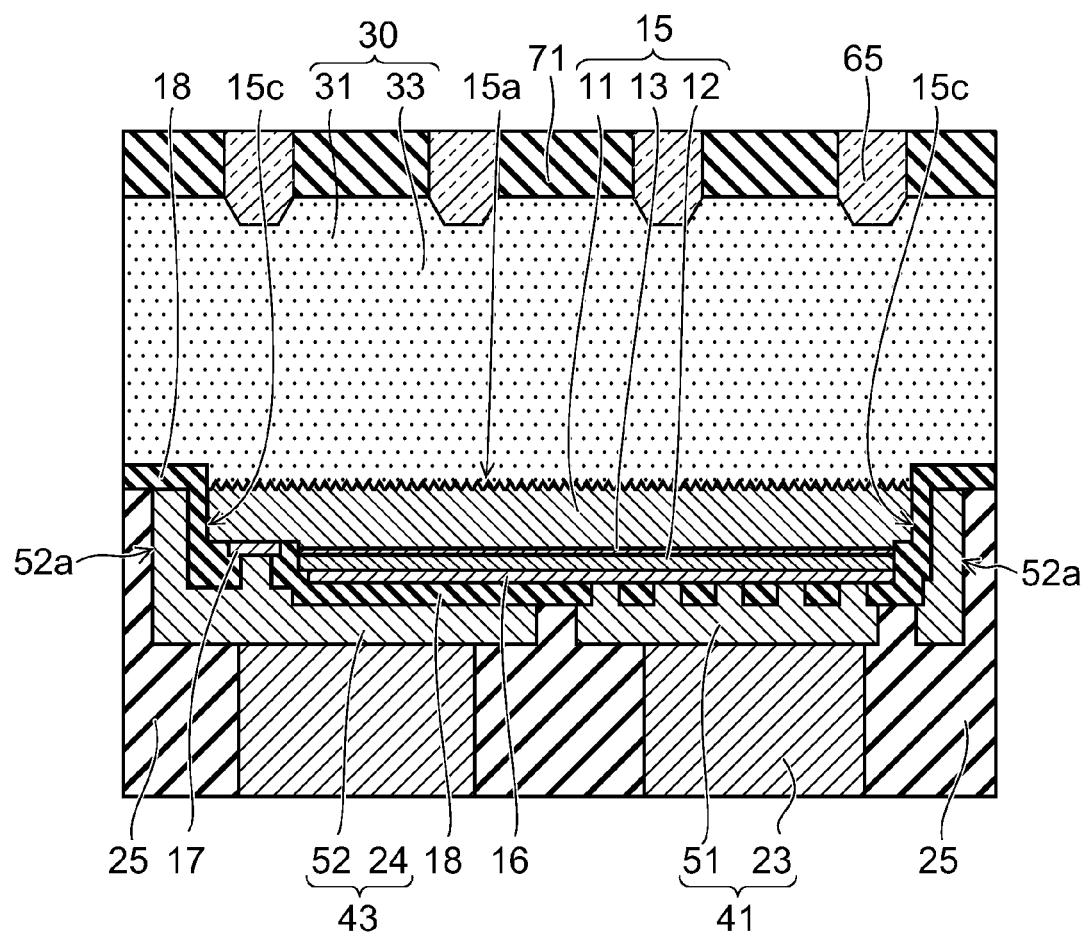
FIG. 17 is a schematic cross-sectional view of a variation of the semiconductor light emitting device of the third embodiment.

Also in the semiconductor light emitting device 3, similarly to the first embodiment, the scattering layer 60 is provided on the fluorescent material layer 30 as a reflection film that reflects the radiated light of the light emitting layer 13 (excitation light). Alternatively, as shown in FIG. 17, the dielectric film 71 described in the second embodiment may be provided on the fluorescent material layer 30.

Also in the third embodiment, by adjusting the in-wafer-plane distribution of the coverage of the reflection film (the scattering layer 60 or the dielectric film 71) in accordance with optical characteristics similarly to the embodiments described above, the in-wafer-plane distribution of the chromaticity of light emitted to the outside can be equalized, and what is called color breakup in which the chromaticity varies with the angle of viewing can be suppressed.

In the third embodiment, as shown in FIG. 15A and FIG. 15B, the n-side interconnection layer 52 extends across the outer edge of the semiconductor layer 15. The extending portion 52a of the n-side interconnection layer 52 surrounds the p-side interconnection layer 51, and covers the side surface 15c of the semiconductor layer 15.

The extending portion 52a of the n-side interconnection layer 52 blocks the light emitted from the side surface 15c out of the light emitted from the light emitting layer 13. Therefore, the light distribution characteristics of the semiconductor light emitting device 3 can be improved. That is, the excitation light not passing through the fluorescent material layer 30 but emitted from the side surface of the semiconductor light emitting device 3 can be suppressed, and color breakup can be prevented.

Figure 16A:
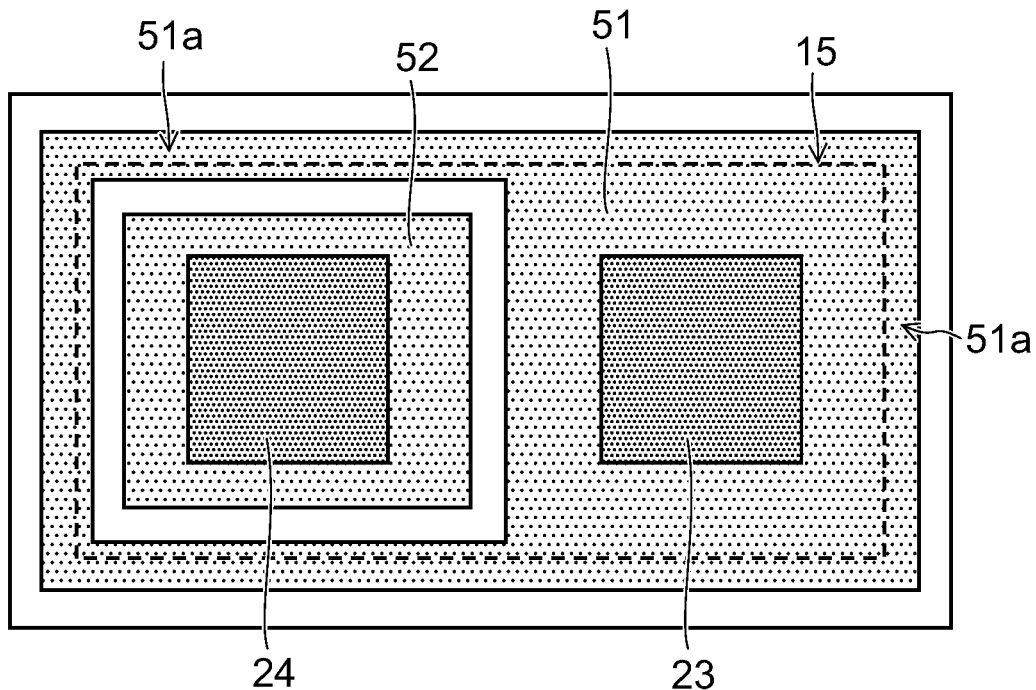
FIGS. 16A and 16B are schematic views of a semiconductor light emitting device of the third embodiment.
Figure 16B:
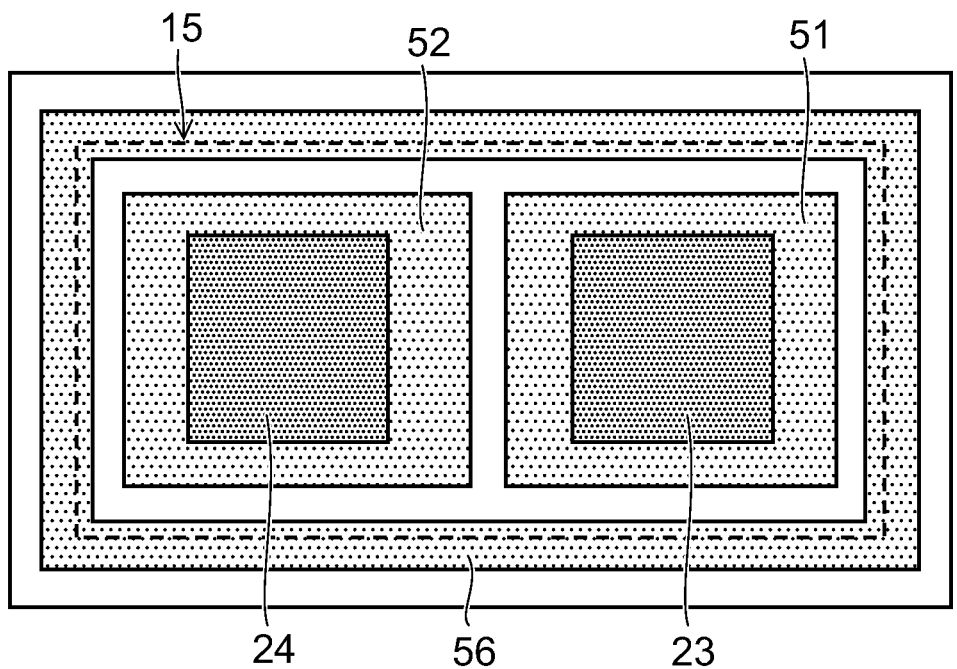

FIG. 16A and FIG. 16B are plan views showing variation examples of the semiconductor light emitting device of the third embodiment. FIG. 16A and FIG. 16B show arrangements of the p-side interconnection unit 41 and the n-side interconnection unit 43 as viewed from the second surface side of the semiconductor layer 15.

In the semiconductor light emitting device of the third embodiment, as shown in FIG. 16A, the p-side interconnection layer 51 may extend across the outer edge of the semiconductor layer 15. The extending portion 51a of the p-side interconnection layer 51 surrounds the n-side interconnection layer 52, and covers the side surface 15c of the semiconductor layer 15. The extending portion 51a of the p-side interconnection layer 51 blocks the light emitted from the side surface 15c out of the light emitted from the light emitting layer 13.

In the semiconductor light emitting device of the third embodiment, as shown in FIG. 16B, it is also possible to provide a light blocking layer 56 that surrounds the p-side interconnection layer 51 and the n-side interconnection layer 52 and covers the side surface 15c of the semiconductor layer 15. The light blocking layer 56 is, for example, the same metal layer as the p-side interconnection layer 51 and the n-side interconnection layer 52, and is provided away from the p-side interconnection layer 51 and the n-side interconnection layer 52. The light blocking layer 56 blocks the light emitted from the side surface 15c out of the light emitted from the light emitting layer 13.

The structures shown in FIG. 16A and FIG. 16B can suppress the excitation light not passing through the fluorescent material layer 30 but emitted from the side surface of the semiconductor light emitting device, and can improve the light distribution characteristics.

As a still another variation example of the embodiment, a structure is possible in which the p-side metal pillar 23 and the n-side metal pillar 24 are not provided and the p-side interconnection layer 21 and the n-side interconnection layer 22 are bonded to pads of the mounting substrate.

The p-side interconnection layer 21 and the p-side metal pillar 23 are not limited to being separate bodies, and the configuration may include the p-side interconnection unit 41 in which the p-side interconnection layer 21 and the p-side metal pillar 23 are integrally provided. Similarly, the n-side interconnection layer 22 and the n-side metal pillar 24 are not limited to being separate bodies, and the configuration may include the n-side interconnection unit 43 in which the n-side interconnection layer 22 and the n-side metal pillar 24 are integrally provided.

Fourth Embodiment

Figure 18A:
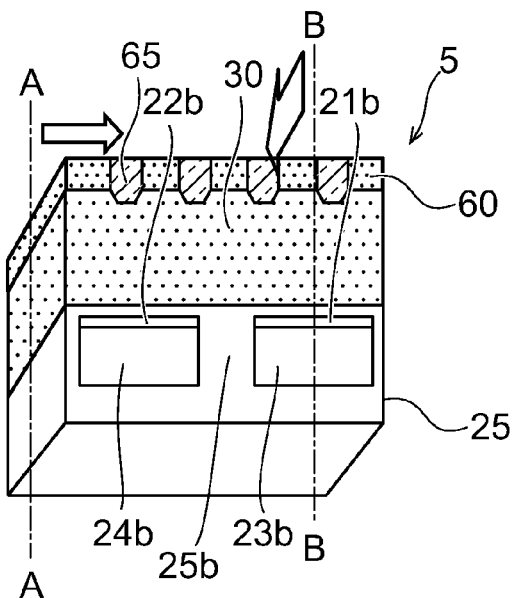
FIGS. 18A to 18C are schematic views of a semiconductor light emitting device of a fourth embodiment.

FIG. 18A is a schematic perspective view of a semiconductor light emitting device 5 of a fourth embodiment.

Figure 18B:
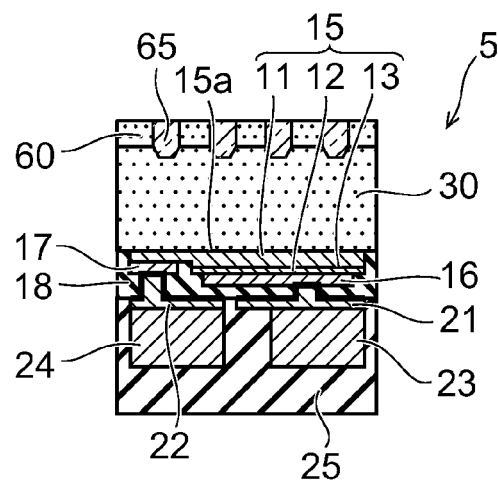

FIG. 18B is a cross-sectional view taken along line A-A in FIG. 18A.

Figure 18C:
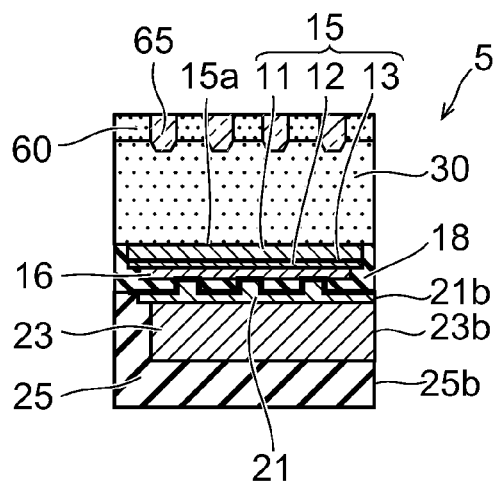

FIG. 18C is a cross-sectional view taken along line B-B in FIG. 18A.

Figure 19A:
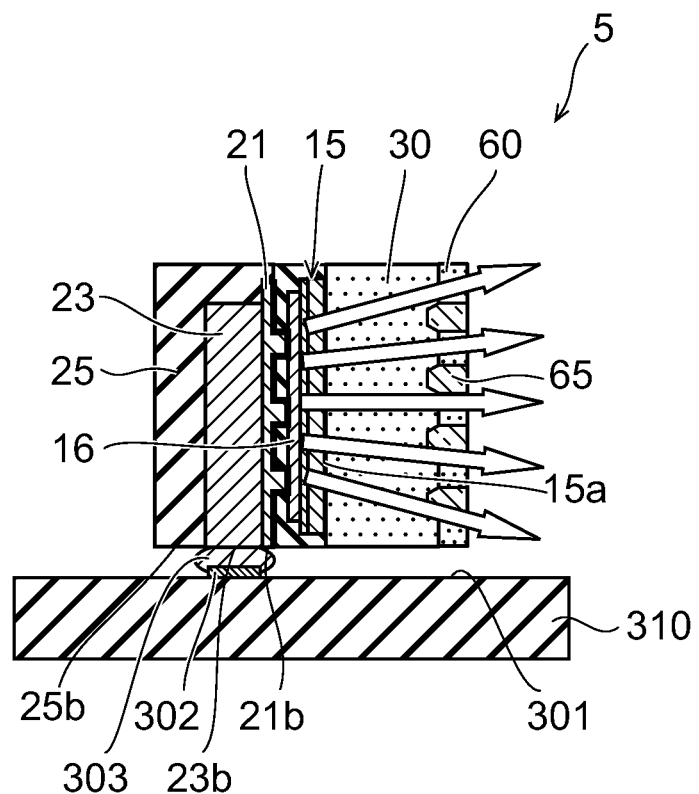
FIGS. 19A and 19B are schematic views of the semiconductor light emitting device of the fourth embodiment.
Figure 19B:
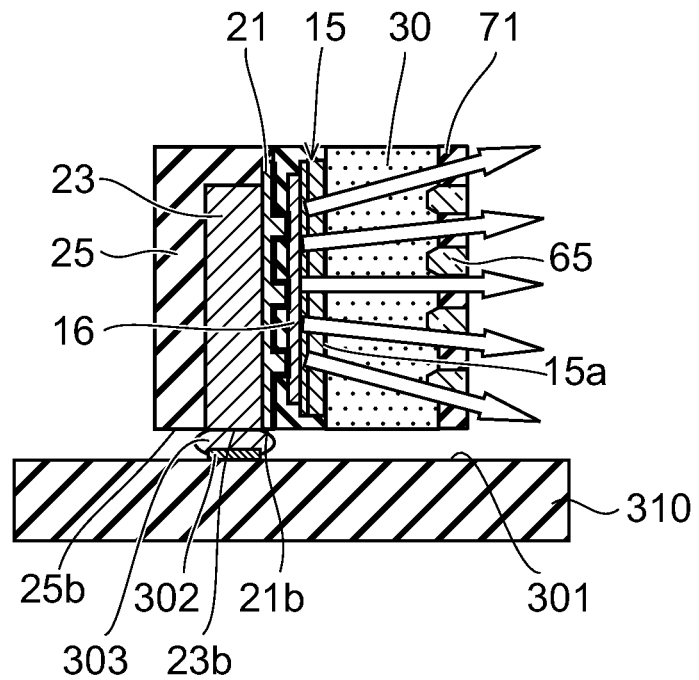

FIGS. 19A and 19B are schematic cross-sectional views of light emitting modules having a configuration in which the semiconductor light emitting device 5 of the fourth embodiment is mounted on a mounting substrate 310.

As shown in FIG. 18A and FIG. 18C, part of the side surfaces of the p-side metal pillar 23 is exposed from the insulating film 25 at a third surface 25b that has a different plane direction from the first surface 15a and the second surface on the opposite side to it of the semiconductor layer 15. The exposed surface functions as a p-side external terminal 23b for mounting on the external mounting substrate 310.

The third surface 25b is, for example, a surface substantially perpendicular to the first surface 15a and the second surface of the semiconductor layer 15. The insulating film 25 has, for example, four rectangular side surfaces, and one of the side surfaces is the third surface 25b.

At the same third surface 25b, part of the side surfaces of the n-side metal pillar 24 is exposed from the insulating film 25. The exposed surface functions as an n-side external terminal 24b for mounting on the external mounting substrate 310.

As shown in FIG. 18A, also part 21b of the side surfaces of the p-side interconnection layer 21 is exposed from the insulating film 25 at the third surface 25b, and functions as a p-side external terminal. Similarly, also part 22b of the side surfaces of the n-side interconnection layer 22 is exposed from the insulating film 25 at the third surface 25b, and functions as an n-side external terminal.

In the p-side metal pillar 23, the portion other than the p-side external terminal 23b exposed at the third surface 25b is covered with the insulating film 25. In the n-side metal pillar 24, the portion other than the n-side external terminal 24b exposed at the third surface 25b is covered with the insulating film 25.

In the p-side interconnection layer 21, the portion other than the side surface 21b exposed at the third surface 25b is covered with the insulating film 25. In the n-side interconnection layer 22, the portion other than the side surface 22b exposed at the third surface 25b is covered with the insulating film 25.

As shown in FIGS. 19A and 19B, the semiconductor light emitting device 5 is mounted in a state where the third surface 25b is opposed to the mounting surface 301 of the substrate 310. The p-side external terminal 23b and the n-side external terminal 24b exposed at the third surface 25b are bonded individually to pads 302 provided on the mounting surface 301 via a solder 303. On the mounting surface 301 of the substrate 310, for example, an interconnection pattern connected to an external circuit is provided, and the pads 302 are connected to the interconnection pattern.

The third surface 25b is substantially perpendicular to the first surface 15a, which is a major exit surface of light. Therefore, in a state where the third surface 25b is opposed to the mounting surface 301 side, the first surface 15a faces in the lateral direction parallel to the mounting surface 301 or in a direction inclined with respect to the mounting surface 301. That is, the semiconductor light emitting device 5 is what is called a side view-type semiconductor light emitting device, and emits light in the lateral direction parallel to the mounting surface 301 or in an oblique direction.

Also in the semiconductor light emitting device 5 of the fourth embodiment, the scattering layer 60 is provided on the fluorescent material layer 30 similarly to the first embodiment. Alternatively, as shown in FIG. 19B, the dielectric film 71 of the second embodiment may be provided on the fluorescent material layer 30. The reflection film (the scattering layer 60 or the dielectric film 71) is opposed to the first surface 15a via the fluorescent material layer 30.

Also in the fourth embodiment, by adjusting the in-wafer-plane distribution of the coverage of the reflection film (the scattering layer 60 or the dielectric film 71) in accordance with optical characteristics similarly to the embodiments described above, the in-wafer-plane distribution of the chromaticity of light emitted to the outside can be equalized, and what is called color breakup in which the chromaticity varies with the angle of viewing can be suppressed.

In the embodiment, the film thickness of the dielectric film is ½ of the wavelength of the radiated light of the light emitting layer.

In the embodiment, the wavelength of the radiated light of the light emitting layer is 430 to 470 nm.

In the embodiment, the p-side interconnection unit includes a p-side interconnection layer connected to the p-side electrode and a p-side metal pillar connected to the p-side interconnection layer and having a larger thickness than the p-side interconnection layer, and the n-side interconnection unit includes an n-side interconnection layer connected to the n-side electrode and an n-side metal pillar connected to the n-side interconnection layer and having a larger thickness than the n-side interconnection layer.

In the embodiment, the side surface of the reflection film and the side surface of the fluorescent material layer are even with each other.

In the embodiment, the side surface of the reflection film, the side surface of the fluorescent material layer, and the side surface of the insulating film are even with each other.

In the embodiment, a method for manufacturing a semiconductor light emitting device includes forming a wafer with a plurality of light emitting elements formed, each of the plurality of light emitting elements including a semiconductor layer having a first surface and a second surface on the opposite side to the first surface and including a light emitting layer, a p-side electrode provided on the semiconductor layer on the second surface side, and an n-side electrode provided on the semiconductor layer on the second surface side, forming a fluorescent material layer on the first surface, the fluorescent material layer containing a plurality of fluorescent materials configured to be excited by the radiated light of the light emitting layer and emit light of a different wavelength from the radiated light of the light emitting layer and a bonding material integrating the plurality of fluorescent materials and configured to transmit the radiated light of the light emitting layer and the radiated light of the fluorescent material, forming a reflection film on the fluorescent material layer, the reflection film having a higher reflectance to the radiated light of the light emitting layer than to the radiated light of the fluorescent material, and adjusting the in-wafer-plane distribution of the coverage of the reflection film to the upper surface of the fluorescent material layer.

The embodiment further includes causing the light emitting layer to emit light and measuring optical characteristics of the light emitted from the reflection film side after forming the reflection film, and the in-wafer-plane distribution of the coverage of the reflection film is adjusted in accordance with the optical characteristics.

In the embodiment, the optical characteristics are the in-wafer-plane distribution of the peak wavelength or emission spectrum of the light emitting layer.

In the embodiment, the optical characteristics are the in-wafer-plane distribution of the chromaticity of light emitted from the reflection film side.

The embodiment further includes forming a resist film on the reflection film, exposing the resist film to light by selectively irradiating the resist film with laser light, developing the resist film after exposure to form an opening in the resist film, and selectively removing the reflection film by etching using the resist film with the opening formed as a mask.

In the embodiment, the light emitting element is formed on a substrate, and the fluorescent material layer is formed on the first surface after the substrate is removed.

The embodiment further includes forming a support body more flexible than the semiconductor layer on the second surface side of the semiconductor layer, and the substrate is removed in a state where the light emitting element is supported by the support body.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
a semiconductor layer having a first surface and a second surface on an opposite side to the first surface and including a light emitting layer;
a p-side electrode provided on the semiconductor layer;
an n-side electrode provided on the semiconductor layer;
a fluorescent material layer provided on a side of the first surface, the fluorescent material layer including a plurality of fluorescent materials and a bonding material, the fluorescent materials being excited by radiated light of the light emitting layer and emitting light of a different wavelength from the radiated light of the light emitting layer, the bonding material integrating the fluorescent materials and being transparent to the radiated light of the light emitting layer and radiated light of the fluorescent materials; and
a reflection film provided on a portion of an upper surface of the fluorescent material layer, which is on a side of the fluorescent material layer opposite from the first surface, the reflection film having a higher reflectance to the radiated light of the light emitting layer than to the radiated light of the fluorescent materials;
wherein the reflection film is not provided on another portion of the upper surface of the fluorescent material layer.

2. The device according to claim 1, wherein the reflection film is a scattering layer including a scattering material configured to scatter the radiated light of the light emitting layer.

3. The device according to claim 2, wherein:
a size of the scattering material is smaller than a size of the fluorescent materials and
the scattering layer is thinner than the fluorescent material layer.

4. The device according to claim 2, wherein a size of the scattering material is 1/10 or less of a wavelength of the radiated light of the light emitting layer.

5. The device according to claim 1, wherein the reflection film is a dielectric film having a different refractive index from the bonding material of the fluorescent material layer.

6. The device according to claim 5, wherein a film thickness of the dielectric film is 1/2 of a wavelength of the radiated light of the light emitting layer.

7. The device according to claim 1, wherein a wavelength of the radiated light of the light emitting layer is 430 to 470 nm.

8. The device according to claim 1, wherein the another portion of the upper surface of the fluorescent material layer, where the reflection film is not provided, is more recessed than the portion of the upper surface of the fluorescent material layer where the reflection film is provided.

9. The device according to claim 1, wherein:
the semiconductor layer does not include a substrate on the side of the first surface and
the fluorescent material layer is provided on the side of the first surface without interposing a substrate between the semiconductor layer and the fluorescent material layer.

10. The device according to claim 1, further comprising:
a p-side interconnection unit provided on a side of the second surface, having an externally connectable end, and connected to the p-side electrode;
an n-side interconnection unit provided on the side of the second surface, having an externally connectable end, and connected to the n-side electrode; and
an insulating film provided in contact with a side surface of the p-side interconnection unit and a side surface of the n-side interconnection unit between the p-side interconnection unit and the n-side interconnection unit and constituting a support body along with the p-side interconnection unit and the n-side interconnection unit.

11. The device according to claim 10, wherein:
the p-side interconnection unit includes a p-side interconnection layer connected to the p-side electrode and a p-side metal pillar connected to the p-side interconnection layer, the p-side metal pillar having a larger thickness than the p-side interconnection layer, and
the n-side interconnection unit includes an n-side interconnection layer connected to the n-side electrode and an n-side metal pillar connected to the n-side interconnection layer, the n-side metal pillar having a larger thickness than the n-side interconnection layer.

12. The device according to claim 10, wherein a side surface of the reflection film, a side surface of the fluorescent material layer, and a side surface of the insulating film are even with one another.

13. The device according to claim 1, wherein a side surface of the reflection film and a side surface of the fluorescent material layer are even with each other.

14. The device according to claim 1, wherein the fluorescent material layer is provided on the semiconductor layer via a bonding layer.

15. The device according to claim 1, further comprising a transparent material provided on the another portion of the upper surface of the fluorescent material layer.

16. The device according to claim 15, wherein the upper surface of the fluorescent material layer and an upper surface of the transparent material are flat.

17. The device according to claim 1, further comprising a transparent material buried on the another portion of the upper surface of the fluorescent material layer.

18. The device according to claim 1, further comprising a side wall connecting the another portion of the upper surface of the fluorescent material layer, where the reflection film is not provided, and the portion of the upper surface of the fluorescent material layer where the reflection film is provided, the side wall having a tapered shape.

19. The device according to claim 1, further comprising a side wall connecting the another portion of the upper surface of the fluorescent material layer, where the reflection film is not provided, and the portion of the upper surface of the fluorescent material layer where the reflection film is provided, the side wall having a curved surface shape.

20. The device according to claim 1, wherein the another portion of the upper surface of the fluorescent material layer includes a bottom having a curved surface shape.

21. The device according to claim 1, wherein the reflection film includes an edge protruding in an eaves shape toward inside of the another portion of the upper surface of the fluorescent material layer, past an opening edge of the another portion.

22. A semiconductor light emitting device comprising:
a semiconductor layer having a first surface and a second surface on an opposite side to the first surface and including a light emitting layer;
a p-side electrode provided on the semiconductor layer;
an n-side electrode provided on the semiconductor layer;
an insulating film provided at a peripheral region adjacent to a side surface of the semiconductor layer;
a fluorescent material layer provided on a side of the first surface and on the insulating film, the fluorescent material layer including a plurality of fluorescent materials and a bonding material, the fluorescent materials being excited by radiated light of the light emitting layer and emitting light of a different wavelength from the radiated light of the light emitting layer, the bonding material integrating the fluorescent materials and being transparent to the radiated light of the light emitting layer and radiated light of the fluorescent materials; and
a reflection film partially provided on the fluorescent material layer and having a higher reflectance to the radiated light of the light emitting layer than to the radiated light of the fluorescent materials,
wherein the first surface of the semiconductor layer and a boundary between the insulating film and the fluorescent material layer have a step portion.

\* \* \* \* \*